(12) United States Patent
Mizutani et al.

(10) Patent No.: US 7,250,352 B2
(45) Date of Patent: Jul. 31, 2007

(54) METHODS FOR MANUFACTURING A HYBRID INTEGRATED CIRCUIT DEVICE

(75) Inventors: Masahiko Mizutani, Ota (JP);
Sadamichi Takakusaki, Ota (JP);
Motoichi Nezu, Ora-gun (JP);
Kazutoshi Motegi, Ota (JP); Mitsuru Noguchi, Nitta-gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 215 days.

(21) Appl. No.: 10/421,921

(22) Filed: Apr. 24, 2003

(65) Prior Publication Data
US 2003/0232489 A1    Dec. 18, 2003

(30) Foreign Application Priority Data
Apr. 24, 2002  (JP)  ............................. 2002-121750
Aug. 30, 2002  (JP)  ............................. 2002-253987

(51) Int. Cl.
*H01L 21/46*  (2006.01)

(52) U.S. Cl. ...................... 438/460; 438/462; 438/465

(58) Field of Classification Search ........ 438/458–465, 438/113, 114
See application file for complete search history.

(56) References Cited

U.S. PATENT DOCUMENTS 5,194,877 A * 3/1993 Lam et al. .................... 347/63
2002/0168796 A1* 11/2002 Shimanuki et al. ......... 438/106
2003/0127428 A1* 7/2003 Fujii et al. .................... 216/65
2003/0194168 A1* 10/2003 Ouchi ......................... 385/14

* cited by examiner

*Primary Examiner*—H. Jey Tsai
(74) *Attorney, Agent, or Firm*—Stephen B. Parker; Watchstone P+D, plc

(57) ABSTRACT

In preferred embodiments, a method of manufacturing a hybrid integrated circuit device is provided, in which a plurality of circuit substrates 10 are manufactured from a single metal substrate 10A' by dicing. In some embodiments, the method includes: preparing a metal substrate 10A' having an insulating layer 11 formed on the top surface thereof; forming a plurality of conductive patterns 12 on the top surface of insulating layer 11; forming grooves 20 in lattice form on the rear surface of metal substrate 10B'; mounting hybrid integrated circuits onto conductive patterns 12; and separating individual circuit substrates 10 with, for example, a rotatable cutter.

28 Claims, 25 Drawing Sheets

METHODS FOR MANUFACTURING A HYBRID INTEGRATED CIRCUIT DEVICE

Priority is claimed to Japanese Patent Application Serial Numbers JP2002-121750, filed on Apr. 24, 2002, and JP2002-253987, filed on Aug. 30, 2002, the disclosures of which are incorporated herein by reference in their entireties. Priority is also claimed to Japanese Application Serial Number JP2002-121748, filed on Apr. 24, 2002.

BACKGROUND OF THE INVENTION

1. Field of the Invention

The present invention pertains generally to integrated circuit devices and preferred embodiments pertain generally to methods for manufacturing a hybrid integrated circuit device and, more particularly, to a hybrid integrated circuit device manufacturing method with which a plurality of circuit substrates are manufactured by dicing from a single, large-size metal substrate.

2. Description of the Related Art

The following description sets forth the inventors' knowledge of related art and problems therein and should not necessarily be construed as an admission of knowledge in the prior art.

A hybrid integrated circuit device from the related art shall now be described with reference to FIGS. 24(A)-(B). In this regard, FIG. 24(A) is a perspective view of a hybrid integrated circuit device 6. FIG. 24(B) is a sectional view taken along the line X-X' of FIG. 24(A).

As illustrated in FIGS. 24(A) and 24(B), the existing hybrid integrated circuit device 6 has the following arrangement. The hybrid integrated circuit device 6 includes a rectangular substrate 60, a conductive pattern 62 formed on an insulating layer 61 that is disposed on the top surface of substrate 60, circuit elements 63 affixed onto the conductive pattern 62, metal wires 65 which electrically connect circuit elements 63 with the conductive pattern 62, and leads 64 which are electrically connected with the conductive pattern. The hybrid integrated circuit device 6 is completed as a product by sealing the hybrid integrated circuit formed on the top surface of circuit substrate 60 with an insulating resin or a case material, etc.

A method of manufacturing hybrid integrated circuit device 6 shall now be described with reference to FIGS. 25 to 27. First, a step of partitioning a large-size metal substrate 66A into elongated parts will be described with reference to FIGS. 25(A)-25(B). In this regard, FIG. 25(A) is a plan view of large-size metal substrate 66A and FIG. 25(B) is a sectional view of large-size metal substrate 66A. Now, a method of partitioning large-size metal substrate 66A into elongate parts will be described with reference to FIG. 25(A). As shown in FIG. 25(A), a large-size metal substrate 66A is partitioned into elongated parts along lines D4. This partitioning is performed by shearing using a shear force. The metal substrate that has been partitioned into elongated parts may be partitioned further into two or more parts in consideration of workability in a subsequent bonding step, etc. In the illustrated example, the metal substrate that has been partitioned into elongated parts is partitioned further into two metal substrates 66B that differ in length.

The arrangement of a metal substrate 66A shall now be described with reference to FIG. 25(B). As shown, the substrate 66A is formed of aluminum and both of its surfaces have been subjected to an alumite treatment. In addition, an insulating layer 61, for the insulation of the metal substrate 66A with respect to a conductive pattern, is provided on the surface on which a hybrid integrated circuit is to be formed. A copper foil 68, which becomes a conductive pattern 62 (shown in FIG. 26(B)), is press bonded to insulating layer 61.

A step of forming a hybrid integrated circuit 67 on the top surface of the metal substrate 66B that has been partitioned as an elongate part shall now be described with reference to FIGS. 26(A)-(B). In this regard, FIG. 26(A) is a plan view of an elongated metal substrate 66B on which a plurality of hybrid integrated circuits 67 have been formed. FIG. 26(B) is a sectional view of FIG. 26(A).

First, conductive patterns 62 are formed by etching copper foil 68 that has been press bonded onto insulating layer 61. Here, conductive patterns 62 are etched so as to form a plurality of hybrid integrated circuits on the elongated metal substrate 66B. In some cases, a resin overcoat is applied above the conductive patterns 62 in order to protect conductive patterns 62.

Solder or brazing material is then used to affix circuit elements 63 onto predetermined locations on each conductive pattern 62. Passive elements and active elements may be employed generally as circuit elements 63. In cases where a power transistor is mounted, the transistor is mounted onto a heat sink that is affixed to the conductive pattern.

A method of partitioning the metal substrate 66B, on which a plurality of hybrid integrated circuits 67 have been formed, into individual circuit substrates 60 shall now be described with reference to FIG. 27. As shown, individual circuit substrates 60, each having a hybrid integrated circuit 67 formed on a top surface, are partitioned from metal substrate 66B by punching out parts of the circuit substrate 60 using a press. In this regard, the press punches out the metal substrate 66B from the surfaces on which hybrid integrated circuits 67 are formed. In this manner, in order to carry out the punching operation, margins are provided around the peripheral end parts of circuit substrate 60, where margins conductive patterns 62 and circuit elements 63 are not formed.

After individually separating the circuit substrates 60 in the above step, the substrates are then completed as products by a step of sealing the hybrid integrated circuit 67, etc.

The above-described hybrid integrated circuit devices and the methods of manufacture thereof had a number of problems.

As a first problem, during the separation of a circuit substrate 60 from a metal substrate 66B by "punching" with a press, due to the impact of "punching," cracks are often formed in the insulating layer 61 formed on the surface of circuit substrate 60.

As a second problem, the insulating layer 61 is formed on the top surface of metal substrate 66B, which insulating layer 61 is extremely hard since it is highly filled with alumina. As a result, there is the problem that the blade edge of the press for performing "punching" can wear quickly. Furthermore, productivity is lowered because an expert worker is needed to carry out the process of exchanging the blade edge of a press and because the exchange of the blade edge requires a very large amount of time.

As a third problem, when a circuit substrate 60 is separated from a metal substrate 66B by "punching" using a press, the peripheral parts of the metal substrate 66B create a loss of material. As a result, there is a large loss of metal substrate 66B material.

The present invention was made in view of the above and/or other problems in the related art.

SUMMARY OF THE PREFERRED EMBODIMENTS

The preferred embodiments of the present invention have been developed in view of the above mentioned and/or other problems in the related art.

According to some illustrative embodiments, a method of manufacturing a hybrid integrated circuit device, includes: preparing a metal substrate having an insulating layer over a top surface; forming conductive patterns over the insulating layer; forming a lattice of grooves in a rear surface of the metal substrate; mounting a hybrid integrated circuit over at least one of the conductive patterns; and separating individual circuit substrates with a rotatable cutter contacting the metal substrate at locations corresponding to the grooves to cut remaining thicknesses of the metal substrate and the insulating layer.

In some examples, the rotatable cutter is a circular cutter that rotates without an external drive. In other examples, the rotatable cutter is a rotatable saw. In some examples, the grooves have a generally V-shaped cross-section and a depth of the grooves is shallower than a thickness of the metal substrate. In some examples, the metal substrate is formed of a material principally comprising aluminum or copper. In some examples, the metal substrate is an aluminum substrate, wherein top and rear surfaces of the aluminum substrate have been subject to alumite treatment. In some examples, the insulating layer is a resin filled with aluminum.

According to some illustrative embodiments, a method of manufacturing a hybrid integrated circuit device includes: preparing a metal substrate having an insulating layer over a top surface; forming a plurality of conductive patterns over a top surface of the insulating layer; forming lattices of grooves in the top and rear surfaces of the metal substrate; mounting a hybrid integrated circuit on at least one of the conductive patterns; and separating the metal substrate along the grooves into individual circuit substrates.

In some examples, the separating includes bending the metal substrate at the locations where the grooves were formed to separate the metal substrate into the individual circuit substrates. In other examples, the separating includes separating individual circuit substrates with a rotatable cutter contacting the metal substrate at locations corresponding to the grooves to cut remaining thicknesses of the metal substrate and the insulating layer. In some examples, the forming lattices of grooves includes using a cutting saw, with blade edges of a shape corresponding to a cross-section of the grooves, that is rotated at a high speed to form the grooves. In some examples, the blade edges of the saw are substantially flat.

According to some illustrative embodiments, a method of manufacturing an integrated circuit device includes: preparing a substrate having an insulating layer; forming a plurality of conductive patterns over the insulating layer; forming a plurality of grooves in at least one of a top or a bottom surface of the substrate; and separating the metal substrate along the grooves into individual circuit substrates. Preferably, the integrated circuit device is a hybrid integrated circuit device and the substrate is a metal substrate. Preferably, grooves are formed in both the top and bottom surface. Preferably, the grooves in the bottom surface are deeper than the grooves in the top surface.

In some examples, the individual circuit substrates are formed with peripheral sides having inclined parts. In some examples, the method further includes sealing the individual circuit substrates in an insulating resin, such as, e.g., by transfer molding. Preferably, such inclined parts are configured to inhibit entry of resin beneath the substrate during sealing. Preferably, the individual circuit substrates are formed with the conductive patterns very near at least one peripheral end, such as, e.g., within about 2 mm of at least one peripheral end, or within about 1 mm of at least one peripheral end.

In some preferred embodiments, one or more of the following advantages can be achieved.

First, when a large-size metal substrate is partitioned using, e.g., a cut saw that rotates at high speed, the occurrence of "burrs" can be made extremely low in comparison to the related art method of partitioning a substrate by shearing. As a result, the generation of defective products, resulting from the short-circuiting of a hybrid integrated circuit due to "burrs" in an intermediate stage, etc., of the manufacturing process, can thus be prevented.

Second, even when a cut saw becomes worn, the exchange of cut saw is a comparatively simple task and can be performed quickly. The work efficiency can thus be improved in comparison to the existing cases case where a shearing blade is exchanged.

Third, the mounting of, e.g., a few dozen to a few hundred hybrid integrated circuits on a single metal substrate is enabled. The etching step, die bonding step, and wire bonding step can thus be performed as batch processes. The productivity can thereby be improved.

Fourth, in the step of partitioning metal substrate into individual circuit substrates, a circular cutter without a driving force can be rotated by pressing it against the metal substrate and the metal substrate can be partitioned thereby. Since the remaining thickness parts at grooves and insulating layer can thus be cut by the circular cutter, cutting chips will not be generated. The short-circuiting of the hybrid integrated circuits in the manufacturing process can thus be prevented.

Fifth, the metal substrate can be partitioned by pressing a circular cutter against parts corresponding to grooves. The lowering of the voltage resistance of the devices due to the generation of cracks in the resin layer can thus be prevented. Furthermore, the flatness of substrate can be secured.

Sixth, even when circular cutter becomes worn, the exchange of circular cutter is a comparatively simple task and can be performed quickly. The productivity can thus be improved.

Seventh, with some preferred embodiments, individual circuit substrates are separated by "cutting" a metal substrate using a saw or a circular cutter. In cases where circuit substrates are separated using a press as in the related-art examples, different blades needed to be prepared in accordance with the sizes of the circuit substrates to be manufactured. With some preferred embodiments of the present invention, the manufacturing of hybrid integrated circuit devices with circuit substrates that differ in size can be accommodated by simply changing the dicing lines.

Eighth, with some preferred embodiments, a plurality of hybrid integrated circuits are mounted in matrix form on a single metal substrate. Since the respective hybrid integrated circuits are very close to each other, substantially the entire surface of the metal substrate becomes circuit substrates. The waste loss of material can thus be reduced.

Ninth, with some preferred embodiments, since flat parts are provided at blade edges of the V-cut saw for forming first grooves and second grooves in the metal substrate, the wear of the blade edges can be reduced. Early degradation of the cutting performance of the V-cut saw can thus be prevented. Furthermore, even in a case where first grooves are to be formed on the surface of metal substrate on which resin layer is provided, the formation of cracks in resin layer can be prevented.

Tenth, with some preferred embodiments, since first grooves and second grooves are formed in a lattice form on the top surface and rear surface of metal substrate, circuit substrates can be partitioned readily at the locations where the grooves are formed. Methods of partitioning by bending and circular cutter may be considered for the partitioning of the respective circuit substrates and partitioning can be performed readily by using either method.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/or advantages of particular embodiments should not be construed as limiting other embodiments or the claims.

BRIEF DESCRIPTION OF THE DRAWINGS

The accompanying figures are provided by way of example, without limiting the broad scope of the invention or various other embodiments, wherein.

DETAILED DESCRIPTION OF THE PREFERRED EMBODIMENTS

1. First Embodiment (Showing, e.g., Illustrative Devices)

Figure 1A:
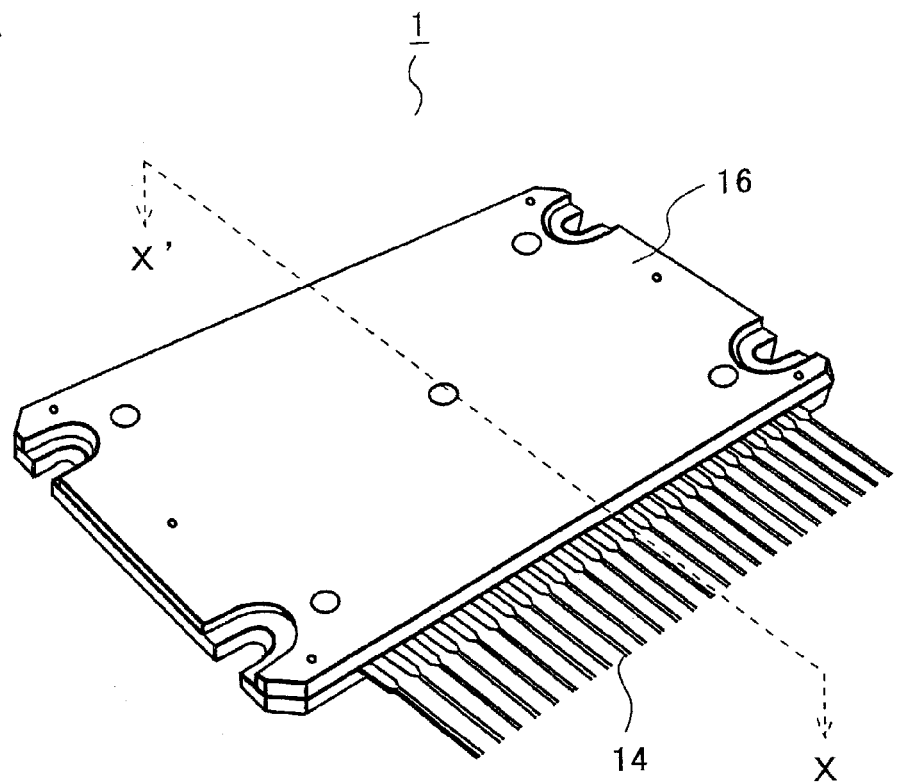
FIG. 1(A) is a perspective view and FIG. 1(B) is a sectional view of a hybrid integrated circuit device according to some illustrative embodiments.
Figure 1B:
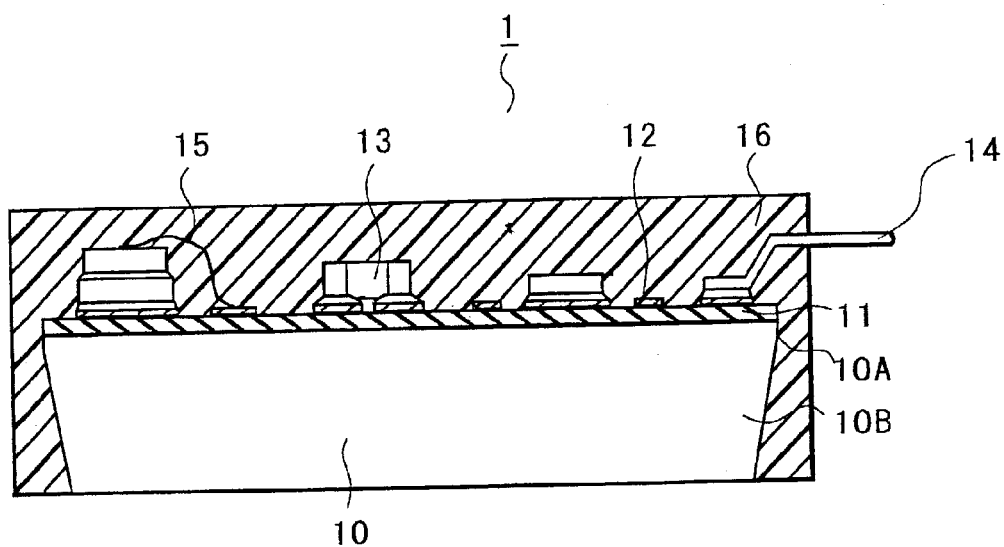

A first illustrative embodiment of the present invention will now be described which demonstrates, among other things, illustrative features of some preferred embodiments of hybrid integrated circuit devices. In this regard, an illustrative arrangement of a hybrid integrated circuit device sealed in an insulating resin is now described with reference to FIGS. 1(A)-(B). FIG. 1(A) is a perspective view of a hybrid integrated circuit device 1. FIG. 1(B) is a sectional view taken along the line X-X' of FIG. 1(A).

The structure of hybrid integrated circuit device 1, according to this illustrative embodiment, shall now be described with reference to FIGS. 1(A)-(B). In the hybrid integrated circuit device 1 shown in these Figures, the hybrid integrated circuit device 1 is preferably sealed in resin as shown.

As shown in FIG. 1(B), an insulating resin 16 preferably has a function of sealing the hybrid integrated circuit, including, for example, circuit elements 13, etc., that are disposed on a top surface of a circuit substrate 10. With respect to the insulating resin 16, any appropriate resin may be employed, such as, by way of example only, a thermoplastic resin (e.g., which seals upon being injection molded), a thermosetting resin (e.g., which seals upon being transfer molded) and/or other appropriate materials may be employed.

As shown in FIG. 1(B), a side face of circuit substrate 10 preferably has a vertical part 10A and an inclined part 10B. Preferably, an angle formed between the top surface and the vertical part 10A of circuit substrate 10 is or is approximately a right angle. On the other hand, an angle formed between the bottom surface and the inclined part 10B of circuit substrate 10 is preferably an obtuse angle as shown. In some illustrative embodiments, the angle can be substantially the same as that depicted in the Figures (all of the appended Figures being to scale in some illustrative and non-limiting embodiments). In this manner, when resin sealing is applied with the bottom surface of circuit substrate 10 exposed as in the FIG. 1(B) (i.e., the bottom or rear surface being that shown at the very bottom of FIG. 1(B)), insulating resin 16 can set around the inclined parts 10B. In this manner, the insulating resin can create an anchor effect between inclined parts 10B and the insulating resin 16.

Figure 2A:
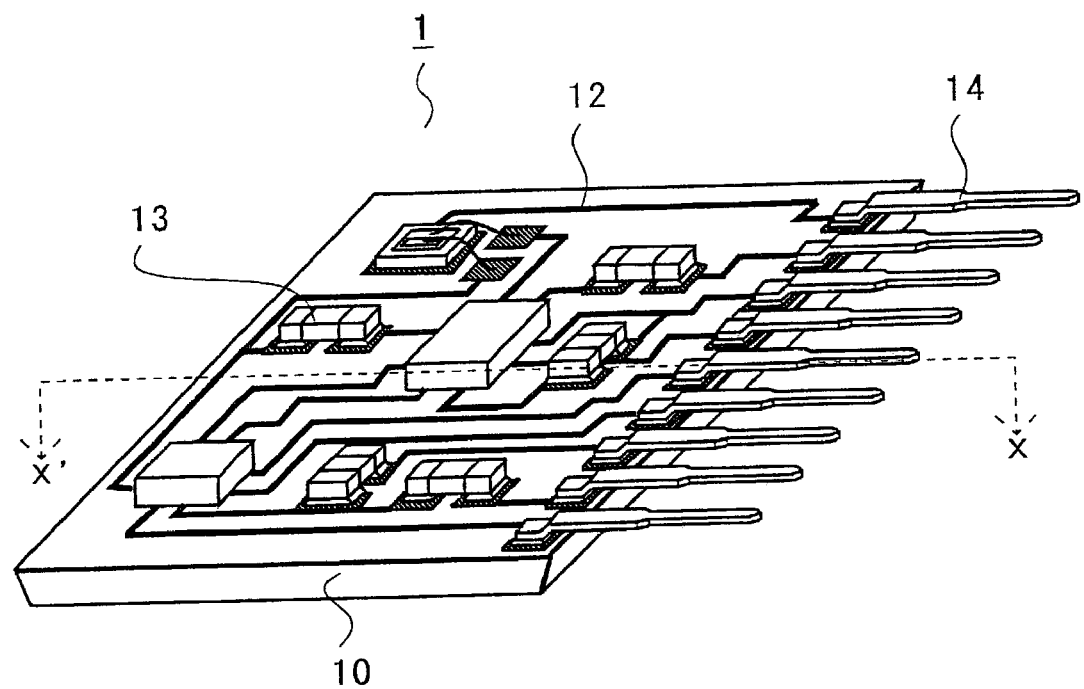
FIG. 2(A) is a perspective view and FIG. 2(B) is a sectional view of a hybrid integrated circuit device according to some illustrative embodiments.

The arrangement, etc., of the hybrid integrated circuit that is formed on circuit substrate 10 according to some preferred embodiments of a hybrid integrated circuit device 1 shall now be described with reference to FIGS. 2(A)-(B). FIG. 2(A) is a perspective view of hybrid integrated circuit device 1 and FIG. 2(B) is a sectional view along line X-X' of FIG. 2(A).

Figure 2B:
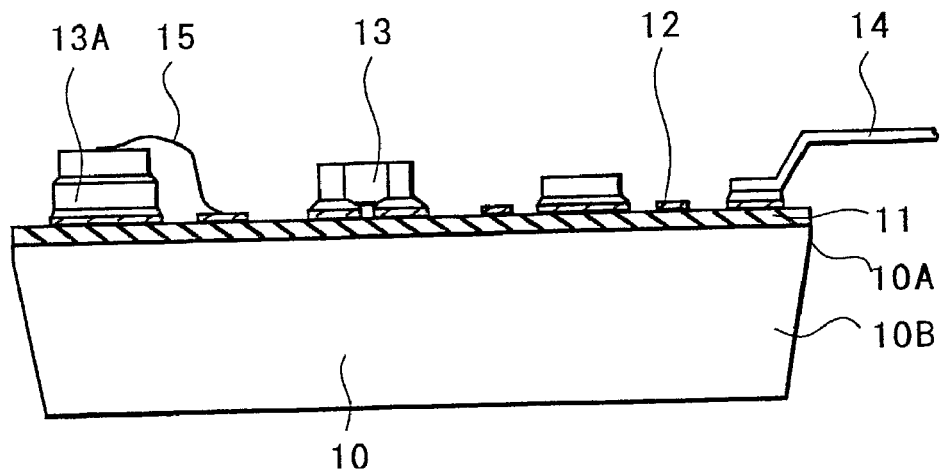
Figure 3:
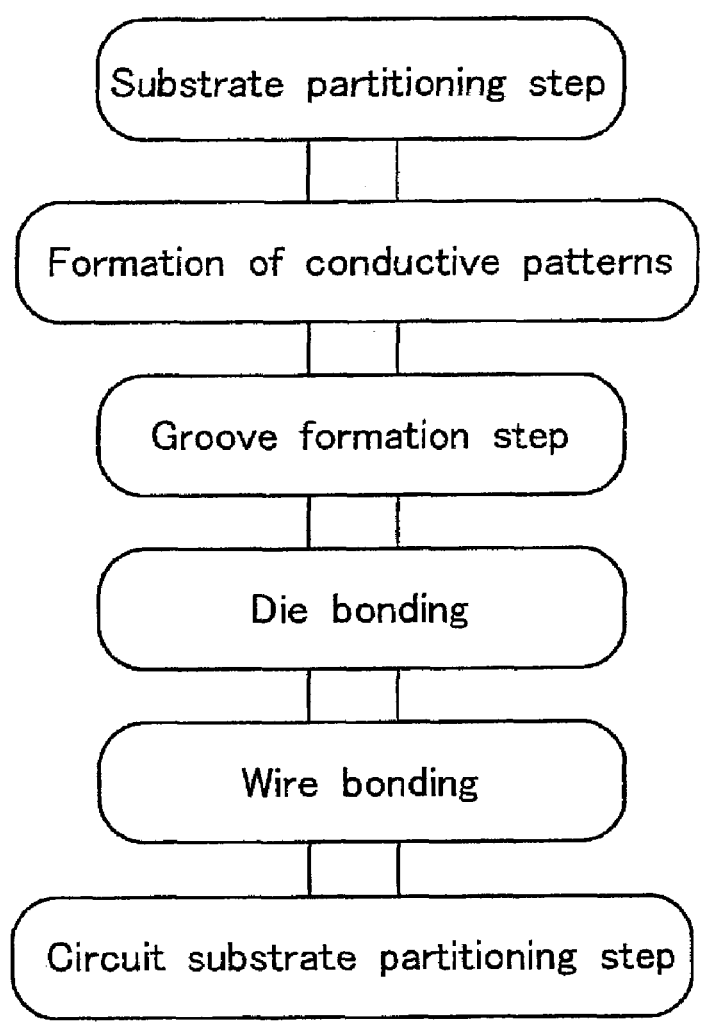
FIG. 3 is a flowchart of a hybrid integrated circuit device manufacturing method according to some illustrative embodiments.

As shown in FIGS. 2(A) and 2(B), a hybrid integrated circuit device 1 is preferably formed as set forth below. In this regard, the hybrid integrated circuit device 1 preferably includes a circuit substrate 10 (formed, e.g., of a metal), an insulating layer 11 (formed, e.g., on a top surface of circuit substrate 10), a conductive pattern 12 (formed, e.g., on the insulating layer 11), circuit elements 13 (mounted, e.g., to predetermined positions on conductive pattern 12), etc. These preferred components shall now be described in detail with reference to some illustrative embodiments.

First, the circuit substrate 10 will now be described. In preferred embodiments, aluminum, copper and/or another metal is used for the material of the circuit substrate 10. In some embodiments, an alloy can be used for the material of circuit substrate 10. In various embodiments, any appropriate materials known to those in the art may be employed. In some preferred embodiments, a circuit substrate 10 that is formed of aluminum is employed. Preferably, both surfaces of the substrate have been subjected to an alumite treatment. In some illustrative embodiments, a side face of circuit substrate 10 is formed with a vertical part 10A that extends vertically from the top surface and an inclined part 10B that inclines towards an inner side of the circuit substrate 10 as it extends downwards from vertical part 10A. While, in some embodiments, the vertical part 10A can be oriented in or substantially in an exactly vertical orientation, in this disclosure, the terminology vertical or vertical part does not signify an exactly vertical orientation, but also encompasses generally vertical orientations.

Preferably, the inclined parts 10B are formed on the side faces of circuit substrate 10 during the manufacturing method. In preferred embodiments, the circuit substrate 10 is manufactured by cutting and dividing a large-size substrate. In a first step, V-shaped or generally V-shaped grooves are preferably formed in a rear surface of the large-size substrate. Then, in a second step, to separate the large-size substrate into individual substrates, the remaining thicknesses of the substrate above the V-shaped grooves are preferably removed starting from, preferably, the top surface. In this manner, the sides of the V-shaped groove parts become the inclined parts 10B of the individual substrates. An illustrative manufacturing method according to some illustrative embodiments for forming circuit substrates 10 shall be described below to demonstrate, by way of example, methods of manufacturing a hybrid integrated circuit device.

Second, the insulating layer 11 will now be described. Insulating layer 11 is preferably formed on a top surface of circuit substrate 10. Preferably, the insulating layer has a function of insulating the conductive pattern 12 and the circuit substrate. Preferably, the insulating layer 11 is also highly filled with, for example, alumina for actively transferring heat generated from, e.g., circuit elements 13 to the circuit substrate 10.

Third, the conductive pattern will now be described. The conductive pattern 12 is preferably disposed on a top surface of insulating layer 11. Preferably, it is formed with copper and/or another metal. In the preferred embodiments, the conductive pattern 12 is formed across substantially the entire or the entire top surface of circuit substrate 10. In this regard, in preferred embodiments, the conductive pattern 12 is formed near one or more peripheral ends of the circuit substrate. In some embodiments, the conductive pattern extends to within 2 mm from one or more peripheral ends of circuit substrate 10. In some embodiments, the conductive pattern extends to within 1 mm from one or more peripheral ends of circuit substrate 10, or even less than 1 mm in other embodiments.

In preferred embodiments, the conductive pattern 12 can be formed near the peripheral end parts of the circuit substrate 10 because of the method used in the partitioning of the circuit substrate 10. While some preferred methods of partitioning circuit substrate 10 shall be described in detail below, generally speaking, individual circuit substrates 10 are preferably separated from a large-size substrate by partitioning the metal substrate in a unique manner (e.g., with a cutter). In the related art example described above, margins near the peripheral end parts of circuit substrate 10 were required because the circuit substrates were partitioned by a press. On the other hand, preferred embodiments herein enable the margins to be eliminated and a conductive pattern 12 to be formed over substantially the entire or the entire top surface of circuit substrate 10.

Fourth, circuit elements 13 will now be described. Preferably, the circuit elements 13 are mounted by solder or brazing material onto predetermined locations of conductive pattern 12. In various embodiments, passive elements and/or active elements can be employed generally as circuit elements 13. In some cases where a power transistor is to be mounted, the transistor is preferably mounted onto a heat sink that is affixed to the conductive pattern. With the preferred embodiments of the invention, a circuit element 13 can be positioned at substantially any location upon the circuit substrate 10. That is, a circuit element 13 can be positioned near a peripheral end part of circuit substrate 10. For example, a circuit element can be positioned on the top surface of circuit substrate within about 2 mm from a peripheral end part of circuit substrate 10, or within about 1 mm from a peripheral end part of a circuit substrate, or even less.

In some embodiments, as shown in FIG. 2(B), a heat sink 13A is mounted to a predetermined location of conductive pattern 12. A power transistor can be mounted on a top surface of this heat sink and the power transistor can be electrically connected with conductive pattern 12 by, e.g., metal wires 15. In these cases, the heat sink 13A can now be positioned at substantially any location on the circuit substrate 10. Specifically, heat sink 13A can be positioned even near a peripheral end part within, e.g., about 2 mm from a peripheral end of circuit substrate 10, or even less. Once again, the heat sink 13 can be formed up to near the peripheral end parts of circuit substrate 10 because of the preferred methods of partitioning the circuit substrate 10 according to the present invention.

As explained above, while some preferred methods of partitioning circuit substrate 10 shall be described in detail below, generally speaking, individual circuit substrates 10 are preferably separated from a large-size substrate by partitioning the metal substrate in a unique manner. In the related art example described above, margins near the peripheral end parts of circuit substrate 10 were required because the circuit substrates were partitioned by a press. Furthermore, since a heat sink 13, onto which a power transistor is mounted, had the greatest height among the circuit elements 13, it could not be positioned at a peripheral part of circuit substrate 10. The preferred embodiments of the present invention enable the margins to be eliminated and enable, e.g., a heat sink 13A to be mounted at substantially any location on the top surface of circuit substrate 10. In various embodiments, this same substantially-any-location benefit can be made available to passive elements, active elements and/or any other circuit elements 13.

In some embodiments, leads 14 are affixed to pads formed of conductive pattern 12 and have a function of performing input and output with respect to the exterior. In addition, a power transistor, etc., can be mounted face-up and electrically connected with the conductive pattern 12 by, e.g., metal wires 15. Furthermore, an overcoat of resin, etc., can be applied to locations of the conductive pattern 12 where an electrical connection is not made.

In preferred embodiments, the arrangement of hybrid integrated circuit device 10 described above provides one or more, preferably all, of the following effects.

First, since the conductive pattern 12 can be formed up to near the end parts of the circuit substrate 10, in cases where the same circuit as that of another existing example is formed, the size of the entire hybrid integrated circuit device can be made small.

Second, since the circuit elements 13 can be positioned up to near the end parts of circuit substrate 10, the degree of freedom in designing the electrical circuit can be improved. Furthermore, since the density of the pattern can be improved, in cases where the same circuit as that of an existing related art example is formed, the size of the entire hybrid integrated circuit device can be reduced.

Third, since an anchor effect is provided between inclined parts 10B of the circuit substrate 10 and the insulating resin 16, a separation of the circuit substrate 10 from insulating resin 16 can be prevented.

Fourth, in preferred embodiments, the parts where the side faces of circuit substrate 10 continue to the rear surface are formed to have an obtuse angle without a rounded shape. In this manner, in some embodiments, in a step of using a mold die for sealing in insulating resin 16 with the rear surface of the circuit substrate being exposed, insulating resin 16 can be prevented from entering into gaps between the mold die and the circuit substrate 10. Insulating resin 16 can thus be prevented from becoming attached to the rear surface of circuit substrate 10. Thus, in preferred embodiments, the corner between the rear surface of the substrate 10 and the inclined part 10B is not rounded in a manner that may facilitate resin flow therearound.

2. Second Embodiment (Showing, e.g., Illustrative Methods)

Some preferred methods for manufacturing a hybrid integrated circuit device, such as, e.g., a device similar to that described above, will now be described with reference to FIGS. 3-11. First, the preferred overall process of this embodiment shall be described with reference to the flowchart of FIG. 3. In this embodiment, a hybrid integrated circuit device is preferably manufactured using at least some, preferably all, of the following steps: cutting and dividing a large-size substrate (e.g., a metal substrate) into mid-size substrates by partitioning the large-size substrate; forming conductive patterns of a plurality of hybrid integrated circuits on a top surface of each mid-size substrate; forming grooves in a lattice form on a surface of each mid-size substrate on which an insulating layer is not provided; performing die bonding to mount circuit elements onto the conductive patterns; performing wire bonding; separating individual circuit substrates by cutting the remaining thickness parts at the grooves of the substrate and the insulating layer, etc. Then, the separated circuit substrates 10 are preferably sealed in an insulating resin. The preferred embodiments of each of these respective steps will be described below.

First Step (See FIG. 4):

In this step, a large-size metal substrate 10A' is preferably partitioned to form mid-size metal substrates 10B'.

Figure 4A:
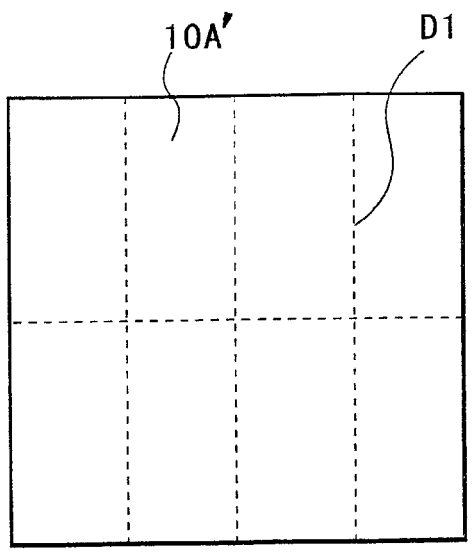
FIG. 4(A) is a plan view.

First, a large-size metal substrate 10A' can be prepared as shown in FIG. 4(A). The size of large-size substrate 10A' can be, for example, approximately 1 m$^2$ (1 square meter) or more. However, the size of the substrate 10A' can vary based on circumstances. In some embodiments, the substrate 10A' can be an aluminum substrate, both surfaces of which have been subject to alumite treatment. Preferably, an insulating layer is provided on the top surface of metal substrate 10A'. A copper foil, which is to become conductive patterns, is preferably formed on the top surface of the insulating layer.

Figure 4B:
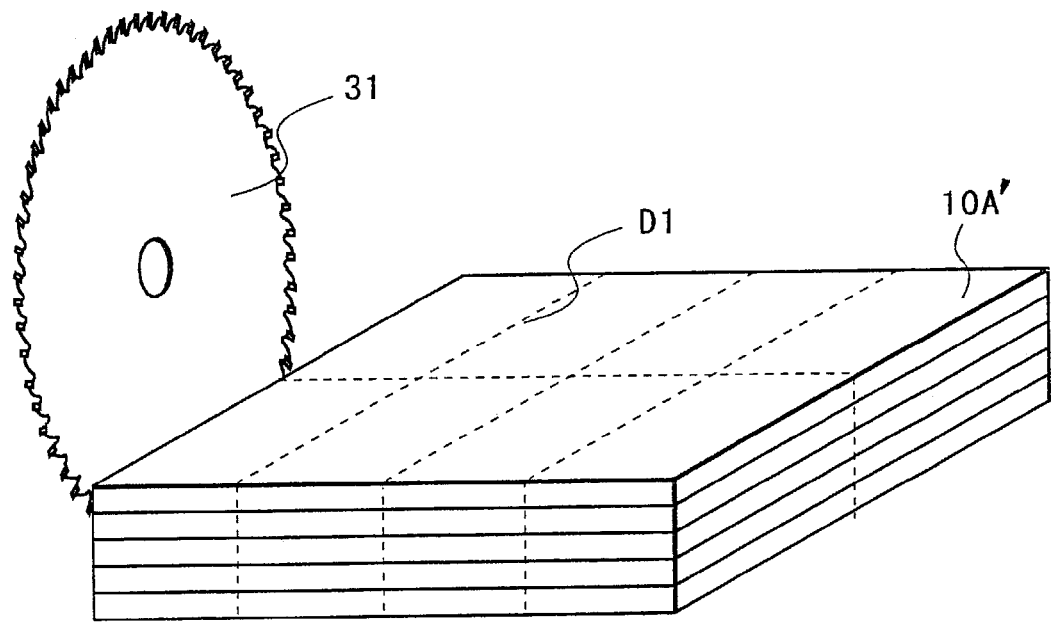
FIG. 4(B) is a perspective view.

Next, as shown in FIG. 4(B), the metal substrate 10A' is partitioned along dicing lines D1 by a cutter 31. In the illustrative embodiment, the cutter 31 includes a rotary saw. However, various other cutters can be used in other embodiments, such as, e.g., knives, blades, scissors, guillotines, shears, reciprocated cutters, rotary cutters and/or various other cutters (see, e.g., other embodiments discussed below). In the illustrated embodiment, a plurality of sheets of metal substrates 10A' can be overlapped and partitioned simultaneously. Preferably, the saw 31 partitions the metal substrate 10A' along dicing lines D1 while rotating at a high speed. The terminology "dicing line" is used to identify the locations along which the partitioning is to be effected and does not necessarily require physical lines or features to be present on the substrate. In this illustrated example, a large-size metal substrate 10A' with a generally square shape is partitioned into eight parts along dicing lines D1 and made into elongated mid-sized metal substrates 10B'. In the illustrated example, the shape of a mid-sized metal substrate 10B' is such that the length of the long side is about twice the length of the short side.

Figure 4C:
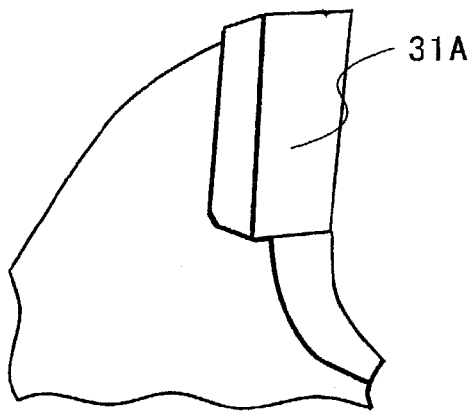
FIG. 4(C) is an enlarged view showing aspects of a hybrid integrated circuit device manufacturing method according to some illustrative embodiments.

While a variety of cutters 31 could be used, in some preferred embodiments, a rotary saw having features as shown in FIG. 4(C) is provided. In that regard, a preferred shape, etc., of a blade edge of a saw 31 is shown in FIG. 4(C). FIG. 4(C) is an enlarged view of the vicinity of a blade edge 31A of the saw 31. As shown, the end part of blade edge 31A is formed to be flat. Preferably, a diamond material is embedded therein. By rotating a saw with such blade edges at a high speed, the metal substrate 10A' can be readily partitioned along dicing lines D1. Once again, various other embodiments can employ different cutters.

Preferably, etching can be performed on a mid-sized metal substrate 10B' manufactured by this step to remove the copper foil partially and thereby form conductive patterns. Though the number of conductive patterns depends on the size of metal substrate 10B' and the size of a hybrid integrated circuit, conductive patterns that form, for example, several dozen to several hundred hybrid integrated circuits can be formed on a single metal substrate 10B'.

Figure 5A:
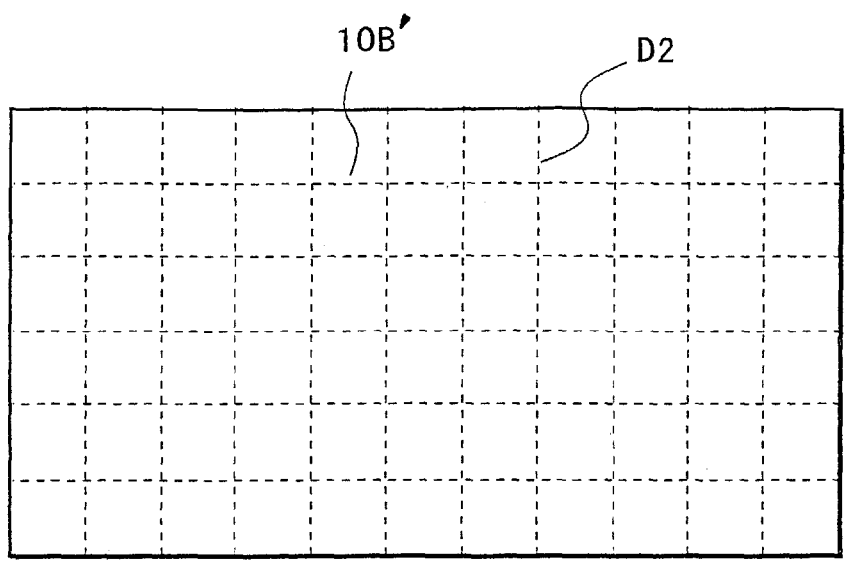
FIG. 5(A) is a plan view.
Figure 5B:
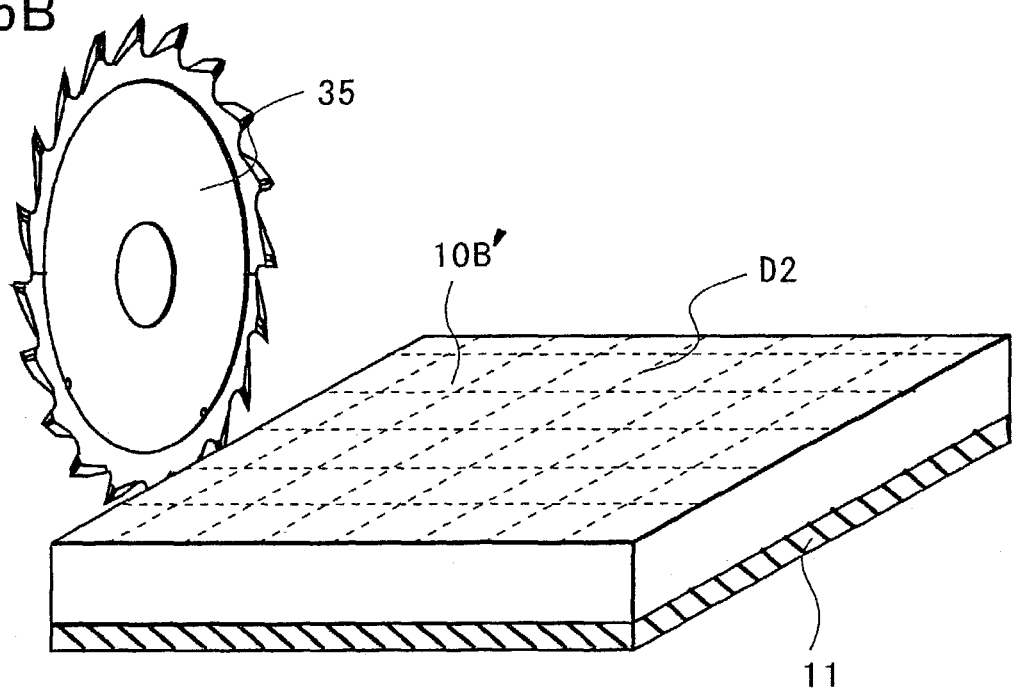
FIG. 5(B) is a perspective view.
Figure 5C:
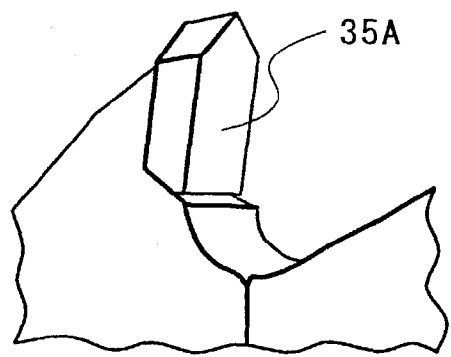
FIG. 5(C) is an enlarged view showing aspects of a hybrid integrated circuit device manufacturing method according to some illustrative embodiments.

Second Step (See FIGS. 5-6):

In this step, grooves 20 are preferably formed in lattice form on the surface of mid-sized metal substrate 10B' on which an insulating layer is not provided. FIG. 5(A) is a plan view of an illustrative mid-sized metal substrate 10 that had been partitioned in a prior step. FIG. 5(B) is a perspective view, showing an illustrative condition in which grooves can be formed in the substrate 10A' using a V-cut saw 35. FIG. 5(C) is an enlarged view of a blade edge 35A of the blade 35 shown in FIG. 5(B).

With reference to FIGS. 5(A)-(B), a V-cut saw 35 can be rotated at a high speed to form grooves in the metal substrate along dicing lines D2. In preferred embodiments, the dicing lines D2 are situated in a lattice form. In preferred embodiments, the dicing lines D2 correspond to boundary lines of individual conductive patterns formed on insulating layer 11. While in the illustrated embodiment, a single cutter, e.g., saw 35, is depicted, various embodiments can employ a plurality of cutters, if desired.

FIG. 5(C) is an enlarged view of the vicinity of a blade edge 35A of the saw 35 illustrating a preferred shape of the V-cut saw 35. In this regard, the V-cut saw 35 is preferably provided with a plurality of blade edges 35A having a shape substantially as shown. Preferably, the shape of a blade edge 35A corresponds to a shape of a groove to be provided in the metal substrate 10A'. In the illustrated example, grooves with a V-shaped cross section are formed on the rear surface of the metal substrate (e.g., a surface on which insulating layer 11 is not provided). The shape of a blade edge 35A is preferably also substantially a V-shape. Preferably, a diamond material is embedded in blade edge 35A.

The preferred shape of metal substrate 10B' in which grooves 20 have been formed will now be described with reference to FIGS. 6(A)-6(B). In that regard, FIG. 6(A) is a perspective view of the metal substrate 10B' with which grooves have been formed by V-cut saw 35 and FIG. 6(B) is a sectional view of metal substrate 10B'.

Figure 6A:
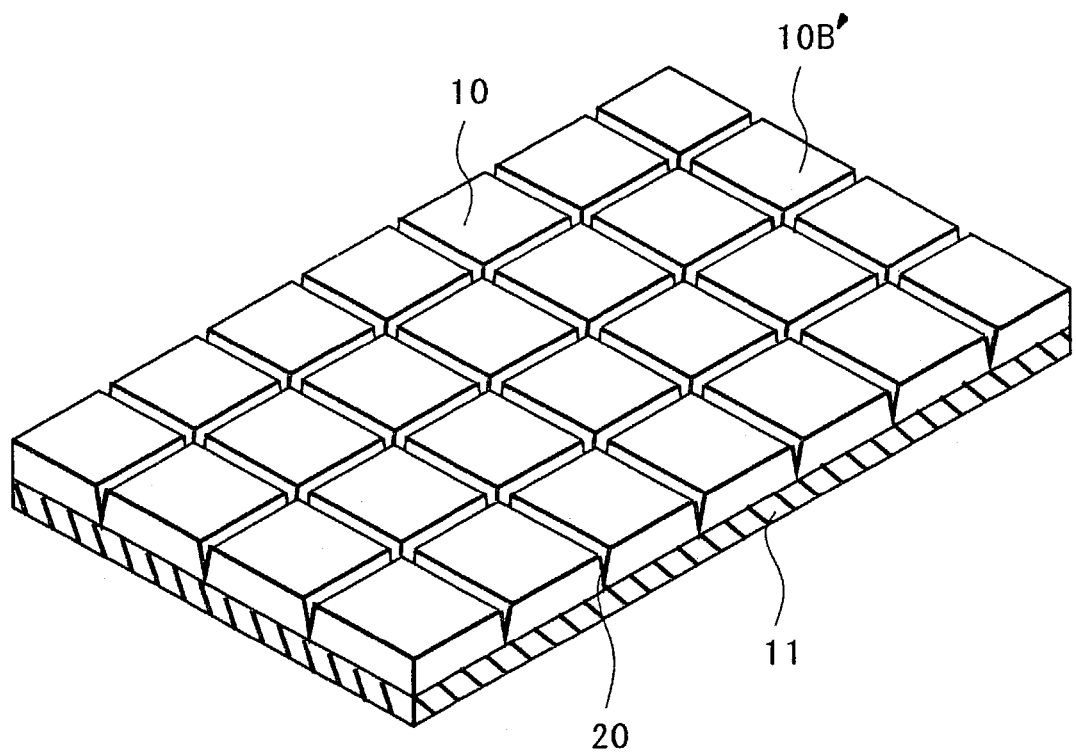
FIG. 6(A) is a perspective view and FIG. 6(B) is a sectional view showing aspects of a hybrid integrated circuit device manufacturing method according to some illustrative embodiments.
Figure 6B:
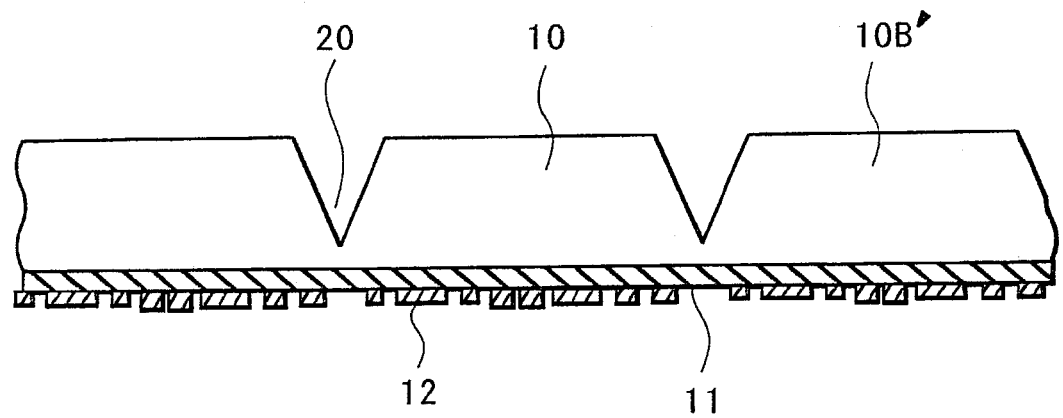

As shown in FIG. 6(A), grooves 20 are preferably formed in a lattice form on the surface of metal substrate 10B' on which insulating layer 11 is not provided. In this embodiment, since the grooves are formed using a V-cut saw 35 having substantially V-shaped blade edges 35A, the grooves 20 are formed to have a substantially V-shaped cross-section. In preferred embodiments, the central lines of grooves 20 (e.g., at an apex of the "V") correspond to the boundary lines of the individual conductive patterns 12 formed on insulating layer 11.

The preferred shape, etc., of a groove 20 will now be described with reference to FIG. 6(B). Here, a groove 20 is preferably formed to have a substantially V-shaped cross section. The depth of groove 20 is preferably made shallower than the thickness of metal substrate 10B'. Thus, in the present step, the metal substrate 10B' is not partitioned into individual circuit substrates 10. That is, the individual circuit substrates 10 are connected at the remaining thickness parts of the metal substrate 10B' that correspond to the groove 20 parts. Thus, until partitioned into the individual circuit substrates 10, the metal substrate 10B' can be handled as a single, sheet-like object. Preferably, if "burrs" are formed in this step, the "burrs" are removed, such as, e.g., by performing high-pressure washing.

Third Step (See FIGS. 7-9):

In this step, the circuit elements 13 are preferably mounted onto conductive patterns 12 and electrical connections are made between the circuit elements 13 and the conductive patterns 12.

Figure 7:
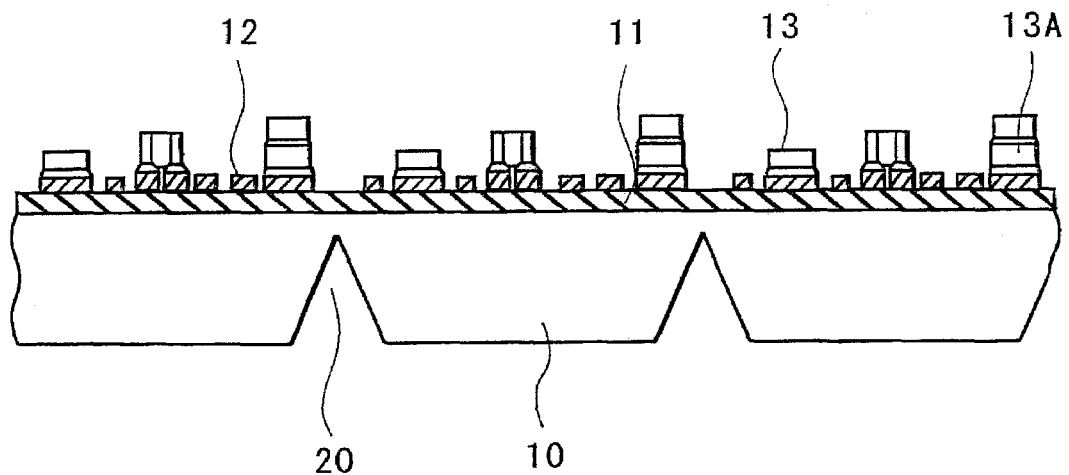
FIG. 7 is a sectional view showing aspects of a hybrid integrated circuit device manufacturing method according to some illustrative embodiments.

A preferred die bonding step, in which circuit elements 13 can be mounted onto conductive patterns 12 shall now be described with reference to FIG. 7. FIG. 7 is a sectional view showing a condition in which circuit elements 13 have been mounted onto conductive patterns 12. Preferably, the circuit elements 13 are mounted onto predetermined locations of conductive patterns 12 by, for example, soft solder or other soldering material. As mentioned above, conductive patterns 12 are preferably formed near the peripheral end parts of circuit substrates 10. The circuit elements 13 can thus also be mounted near the peripheral end parts of circuit substrates 10. Also, a heat sink 13A, on the upper surface of which a power transistor is mounted, is a circuit element that is typically higher in height in comparison to other circuit elements. Thus, with a hybrid integrated circuit device manufacturing method using a press as in the related art, a heat sink 13A could not be positioned near a peripheral end part of a circuit substrate. As shall be described below, in some preferred embodiments of the present invention, the circuit substrates 10 can be partitioned individually using, e.g., a circular cutter. Thus, a heat sink 13A and/or another circuit element 13 with increased height can even be positioned near a peripheral end part of a circuit substrate.

Figure 8:
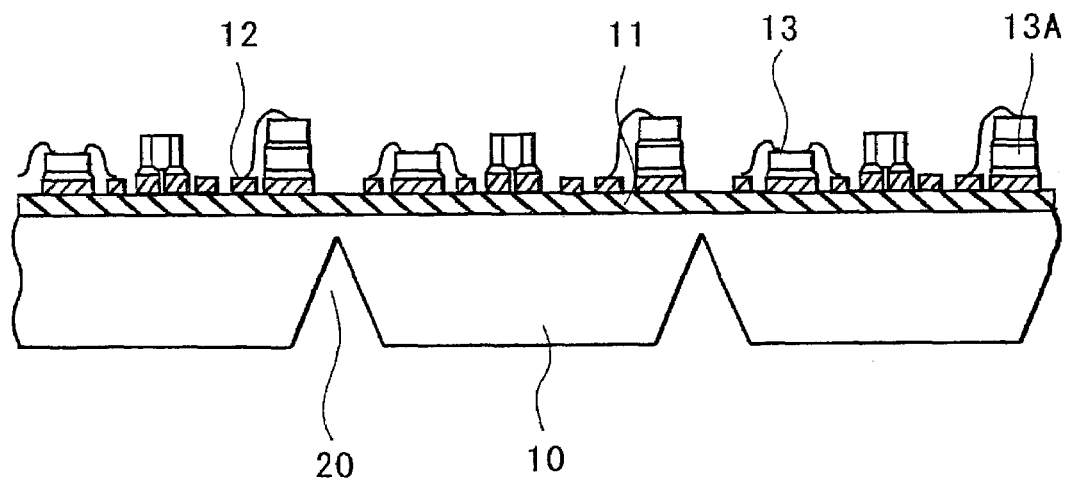
FIG. 8 is a sectional view showing aspects of a hybrid integrated circuit device manufacturing method according to some illustrative embodiments.

A preferred wire bonding step in which electrical connections are made between the circuit elements 13 and the conductive patterns 12 shall now be described with reference to FIG. 8. FIG. 8 is a sectional view showing a condition where circuit elements 13 are electrically connected with conductive pattern 12 by metal wires 15. Here, wire bonding is preferably performed in a batch process on, for example, several dozen to several hundred hybrid integrated circuits formed on a single substrate 10B'.

Figure 9:
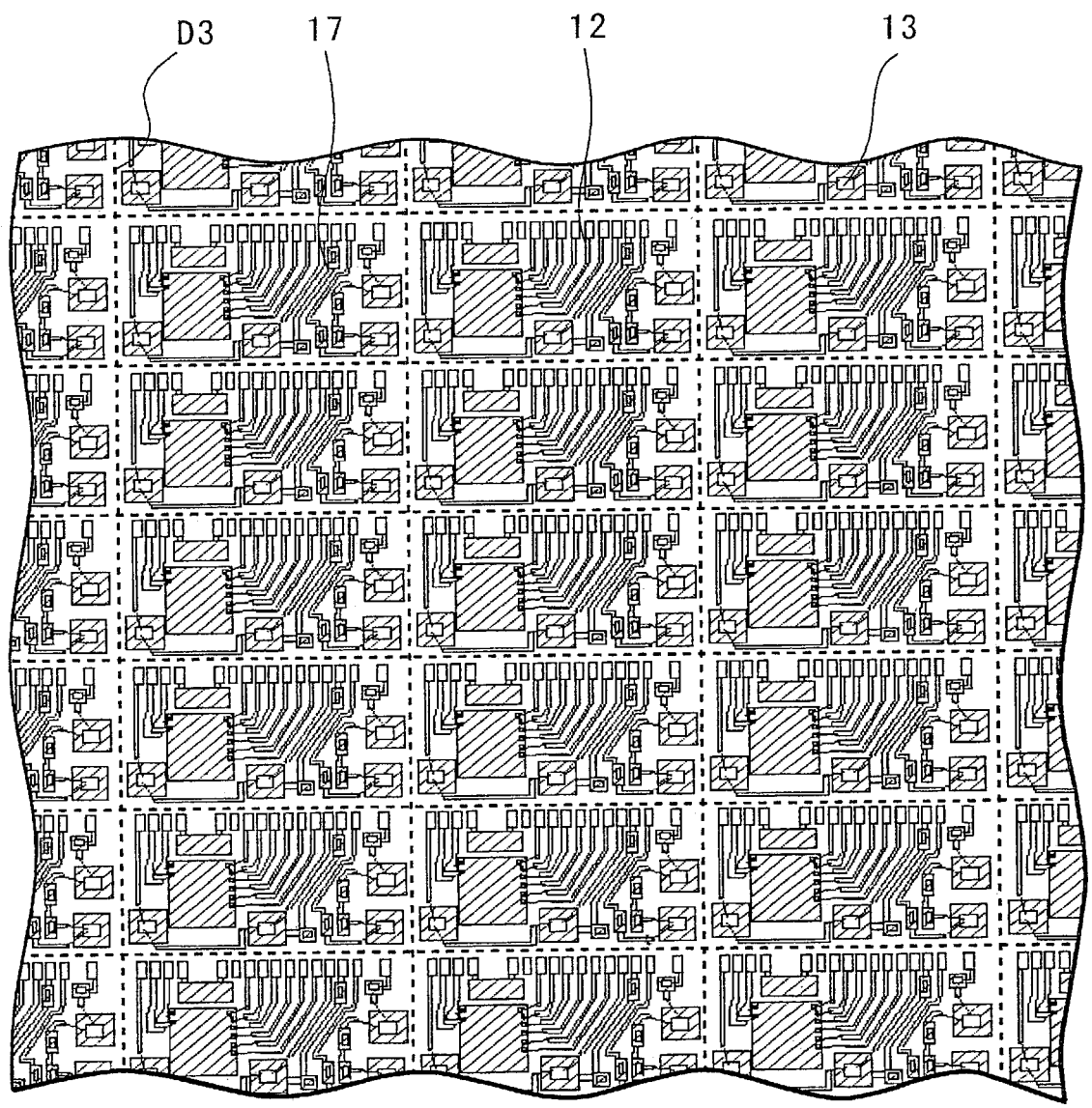
FIG. 9 is a plan view showing aspects of a hybrid integrated circuit device manufacturing method according to some illustrative embodiments.

Illustrative hybrid integrated circuits that have been formed on substrate 10B' shall now be described specifically with reference to FIG. 9. FIG. 9 is a plan view of a part of hybrid integrated circuits 17 formed on metal substrate 10B'. In preferred embodiments, as depicted by the wavy line edges, an even greater number of hybrid integrated circuits 17 are preferably formed. As shown by dotted lines in FIG. 9, the substrate 10B' can be partitioned into individual circuit substrates 10 along dicing lines D3. As depicted in this illustrative Figure, the conductive patterns 12 that form the individual hybrid integrated circuits can be formed very close to the dicing lines D3. In this manner, the conductive patterns 12 can be formed over substantially the entire or the entire the top surface of the substrate 10B'. As also illustrated, heat sinks 13A and other circuit elements 13 can also be disposed at peripheral parts of the hybrid integrated circuits.

In the preferred embodiments described above, hybrid integrated circuits were formed in a batch on a top surface of a substrate 10B' having an elongated shape. In some embodiments, if, e.g., there are restrictions of the manufacturing device for performing the die bonding or wire bonding, the substrate 10B' can be partitioned into desired sizes in a step prior to the present step. In one illustrative example, a metal substrate having a square shape can be obtained by partitioning the metal substrate 10B' in two pieces in a step prior to the present step.

Figure 10A:
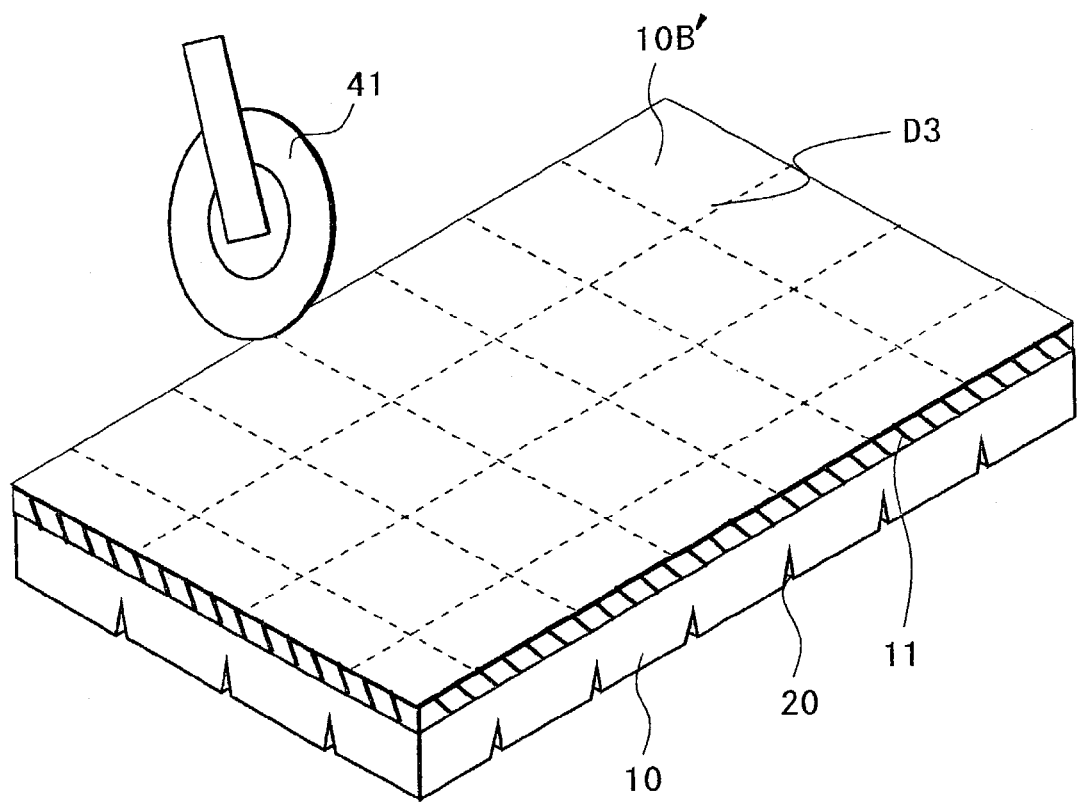
FIG. 10(A) is a perspective view and FIG. 10(B) is a sectional view showing aspects of a hybrid integrated circuit device manufacturing method according to some illustrative embodiments.
Figure 10B:
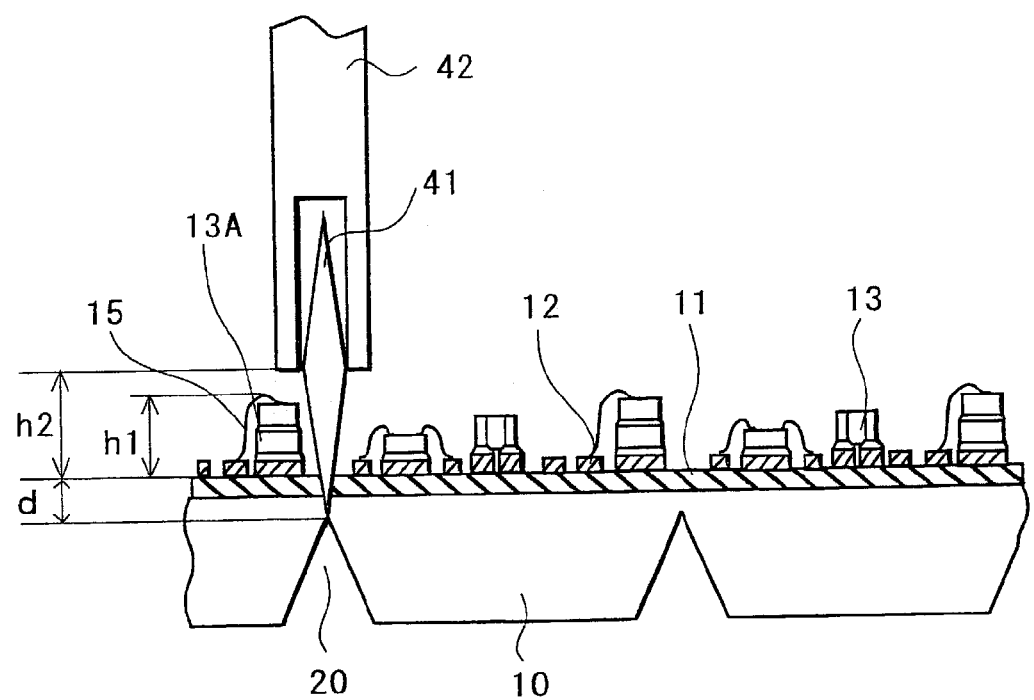

Fourth Step (See FIG. 10):

In this step, the remaining thickness parts at the grooves of metal substrate 10B' and insulating layer 11 are preferably cut to separate the metal substrate 10B' into individual circuit substrates 10. FIG. 10(A) is a perspective view, showing the condition where a metal substrate 10B' is partitioned into individual circuit substrates 10 using a circular cutter 41. FIG. 10(B) is a sectional view of FIG. 10(A). Although not shown in FIG. 10(A), a plurality of hybrid integrated circuits can be already formed on insulating layer 11.

As shown in FIG. 10(A), circular cutter 41 is preferably used in this illustrative embodiment to force-cut the metal substrate 10B' along the dicing lines D3. The metal substrate 10B' can thereby be partitioned into individual circuit substrates 10. As shown in FIG. 10(B), the circular cutter 41 preferably force-cuts the surface of metal substrate 10, on which insulating layer 11 is provided, at parts corresponding to the central lines (e.g., along the apexes) of the grooves 20. Preferably, each groove 20 has a substantially V-shaped cross section. In this manner, the circular cutter 41 can cut the remaining thickness parts of the metal substrate 10B' and the insulating layer 11 at parts where grooves 20 have been formed most deeply (e.g., the deepest parts of the grooves).

The preferred details of circular cutter 41 shall now be described with reference to FIG. 10(B). The circular cutter 41 preferably has the shape of a circular disk. Preferably, as shown in FIG. 10(B), the peripheral edge part is formed into an acute angle. Preferably, the central part of circular cutter 41 is fixed to a supporting part 42 in a manner enabling free rotation of circular cutter 41 (such as, e.g., so as to rotate about a central axis). While the above-described saw 31 cut the metal substrate 10B' while being rotated at high speed by a driving force (such as, e.g., via a drive motor or the like), the circular cutter 41 is preferably not driven by a driving force. Preferably, the circular cutter 41 freely rotates such that it rotates as it is moved along a dicing line D3 while a part of circular cutter 41 is pressed against metal substrate 10B' (e.g., due to the contact therebetween).

The preferred size of the circular cutter 41 shall now be described with reference to FIG. 10(B). With reference to FIG. 10(B), let d be a length obtained by adding the thickness of the remaining part of metal substrate 10B' at a part where a groove 20 has been formed and the thickness of insulating layer 11. And, let h1 be a length from the top part of the highest element among circuit elements 13 to the top surface of insulating layer 11. In this case, a radius of circular cutter 41 (e.g., h2 plus d) is preferably set longer than the length obtained by adding d1 and h1. By this setting, circuit substrates 10 can be readily partitioned without failure from metal substrate 10B'. In addition, a lower end of a supporting part 42, which preferably supports the circular cutter 41, can be prevented from contacting and damaging the circuit element 13.

The preferred details of the partitioning of the metal substrate 10B' by a circular cutter 41 shall now be described with reference to FIG. 10(B). As mentioned above, in preferred embodiments, a heat sink 13A and/or another circuit element 13 with some height can be positioned at a peripheral part of circuit substrate 10. The position of a heat sink 13A may thus be close to a dicing line D3 as shown in FIG. 10. The position of a supporting part 42 can be set so that supporting part 42 will not contact the heat sink 13A in such a case.

For example, if h1 is the distance from a top part of an element with the greatest height among circuit elements 13 to the top surface of insulating layer 11, the length h2 from the lower end of supporting part 42 to the top surface of insulating layer 11, is preferably set longer than h1. While the supporting part 42 is shown as having a lower end proximate a central axis of the cutter 41, the lower end can have a dissimilar position in other embodiments. In the illustrated embodiment, the top part of a metal wire 15 extending from, e.g., a power transistor that is mounted to a heat sink 13A, is the highest part within the hybrid integrated circuit. In this case, the lower end of supporting part 42 is preferably set at a position that is higher than the top part of metal wire 15. By thus setting the position of the lower end of supporting part 42, damaging of the metal wire 15 can be prevented.

Figure 11:
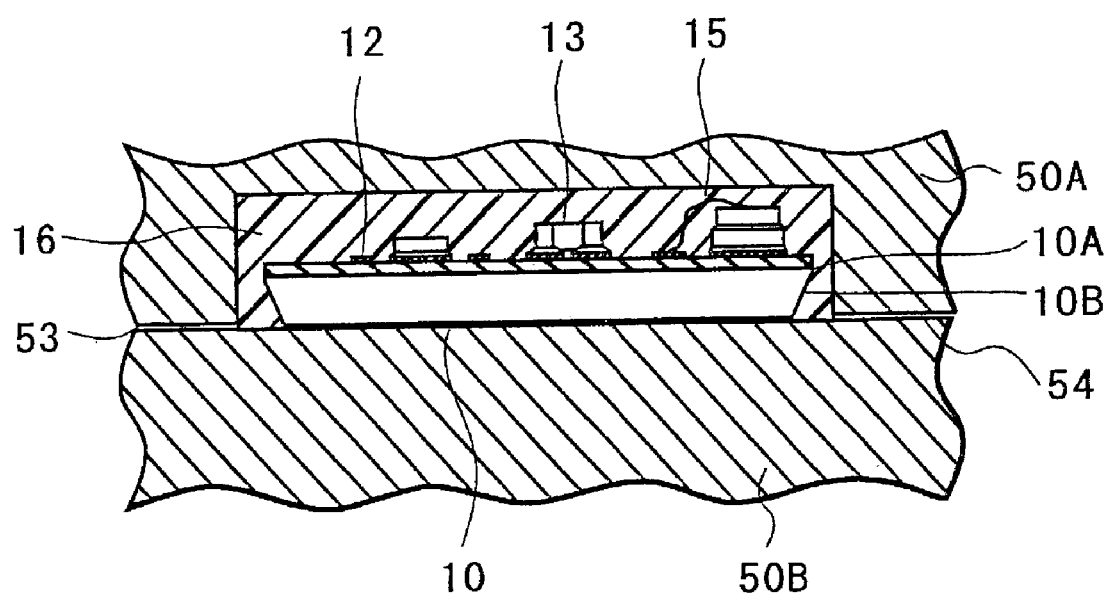
FIG. 11 is a sectional view showing aspects of a hybrid integrated circuit device manufacturing method according to some illustrative embodiments.

Fifth Step (See FIG. 11):

A preferred step of sealing a circuit substrate 10 in an insulating resin 16 shall now be described with reference to FIG. 11. FIG. 11 is a sectional view, showing the step of sealing circuit substrate 10 in an insulating resin 16 by use of, e.g., a mold die 50.

First, circuit substrate 10 is preferably set on a lower mold die 50B. Insulating resin 16 can then be injected through a gate 53. In preferred embodiments, transfer molding using a thermosetting resin or injection molding using a thermosetting resin can be employed as the method of sealing. Air of an amount corresponding to the amount of the insulating resin 16 that is injected from gate 53 can be ejected from the interior of the cavity to the exterior via an air vent 54.

As mentioned above, inclined parts 10B are preferably provided at side face parts of circuit substrate 10. Thus, when sealing in insulating resin, insulating resin 16 is set around the vicinity of inclined part 10B. As a result, an anchor effect is provided between the insulating resin 16 and the inclined part 10B and the joining of insulating resin 16 and circuit substrate 10 can be, thereby, fortified. In addition, in preferred embodiments, the cross-sectional shape of the part where the rear surface of circuit substrate 10 continues to an inclined part 10B is formed to have an obtuse angle. Preferably, the inclined part 10B is not rounded at its bottom end adjacent the rear surface of the substrate so that insulating resin 16, which is injected through the gate 53 into the cavity, is limited from entry beneath the substrate (e.g., between the rear surface of the substrate and the lower mold die 50B). While the inclined part 10B can have substantially any configuration in various embodiments (e.g., straight, arcuate, rounded, convex, concave, irregular, etc.), in preferred embodiments it is configured to inhibit entry of resin beneath the substrate (such as, e.g., not having rounded edges and/or not otherwise configuring the inclined part 10B such that resin may enter therebehind).

Then, the circuit substrate 10, which has been sealed in resin in the above-described step, can be completed as a product upon being subject to, for example, a lead cutting step, etc.

In some circumstances, the foregoing embodiments can provide one or more, preferably all, of the following effects.

First, when a large-size metal substrate is partitioned using, e.g., a saw 31 that rotates at high speed, the occurrence of "burrs" can be made extremely low in comparison to the related art method of partitioning a substrate by shearing. As a result, the generation of defective products, resulting from the short-circuiting of a hybrid integrated circuit due to "burrs" in an intermediate stage, etc., of the manufacturing process, can thus be prevented.

Second, since a plurality of overlapped large-size metal substrates 10A' can be partitioned simultaneously using, e.g., a saw 31, the work efficiency can be improved.

Third, even when the saw 31 becomes worn, the exchange of saw 31 can be a comparatively simple task and can be performed quickly. Thus, the work efficiency can be improved in comparison to the related art case where a shearing blade needs to be exchanged.

Fourth, grooves are formed at parts of metal substrate 10B' that correspond to the boundaries of the individual circuit substrates 10. As a result, even if "warping" occurs across the entirety of metal substrate 10B' in the process of, e.g., transporting metal substrate 10B', the thinned parts corresponding to the grooves 20 will bend first, while the remaining portions can remain substantially unbent. Accordingly, degradation of the flatness of the individual circuit substrates 10 can thus be inhibited.

Fifth, the mounting of, for example, a few dozen to a few hundred hybrid integrated circuits on a single metal substrate 10B' is enabled. The etching step, die bonding step, and wire bonding step can thus be performed as batch processes. The productivity can thereby be improved.

Sixth, in the step of partitioning the metal substrate 10B' into individual circuit substrates 10, a circular cutter 41 without a driving force can be rotated by pressing it against metal substrate 10B' so as to partition the metal substrate 10B'. In this manner, since the remaining thickness parts at grooves 20 and insulating layer 11 are thus cut by circular cutter 41, cutting chips will be virtually eliminated. Accordingly, short-circuiting of the hybrid integrated circuits in the manufacturing process can thus be prevented.

Seventh, the metal substrate 10B' can be partitioned by pressing a circular cutter 41 against regions corresponding to grooves 20 (such as, e.g., at regions above the grooves). Preferably, the lowering of the voltage resistance of the devices due to generation of cracks in resin layer 11 can thus be prevented. Furthermore, the flatness of substrate 10B' can be secured.

Eighth, even when circular cutter 41 becomes worn, the exchange of circular cutter 41 can be a comparatively simple task and can be performed quickly. The productivity can thus be improved.

Ninth, in the preferred embodiments, individual circuit substrates can be separated by "cutting" a metal substrate using, e.g., a cutter, such as, for example, a cutter saw 31 or a circular cutter 41. In cases where circuit substrates are separated using a press as in the related-art example, different blades needed to be prepared in accordance with the sizes of the circuit substrates to be manufactured. In preferred embodiments of the present invention, the manufacturing of hybrid integrated circuit devices with circuit substrates that differ in size can be accommodated by simply changing the dicing lines (i.e., by changing locations along which the cutters are moved). In some embodiments, the cutters can be moved via various moving means, such as, by way of example only, a robot arm that can be controlled via a controller (e.g., to control movement, path of movement, etc.) and/or other means.

Tenth, in preferred embodiments, a plurality of hybrid integrated circuits can be mounted in a matrix form on a single metal substrate 10B'. Since the respective hybrid integrated circuits can be very close to each other, substantially the entire surface of metal substrate 10B' can be made into circuit substrates 10. As a result, the waste loss of material can be substantially diminished.

3. Third Embodiment (Showing, e.g., Illustrative Devices)

Figure 12A:
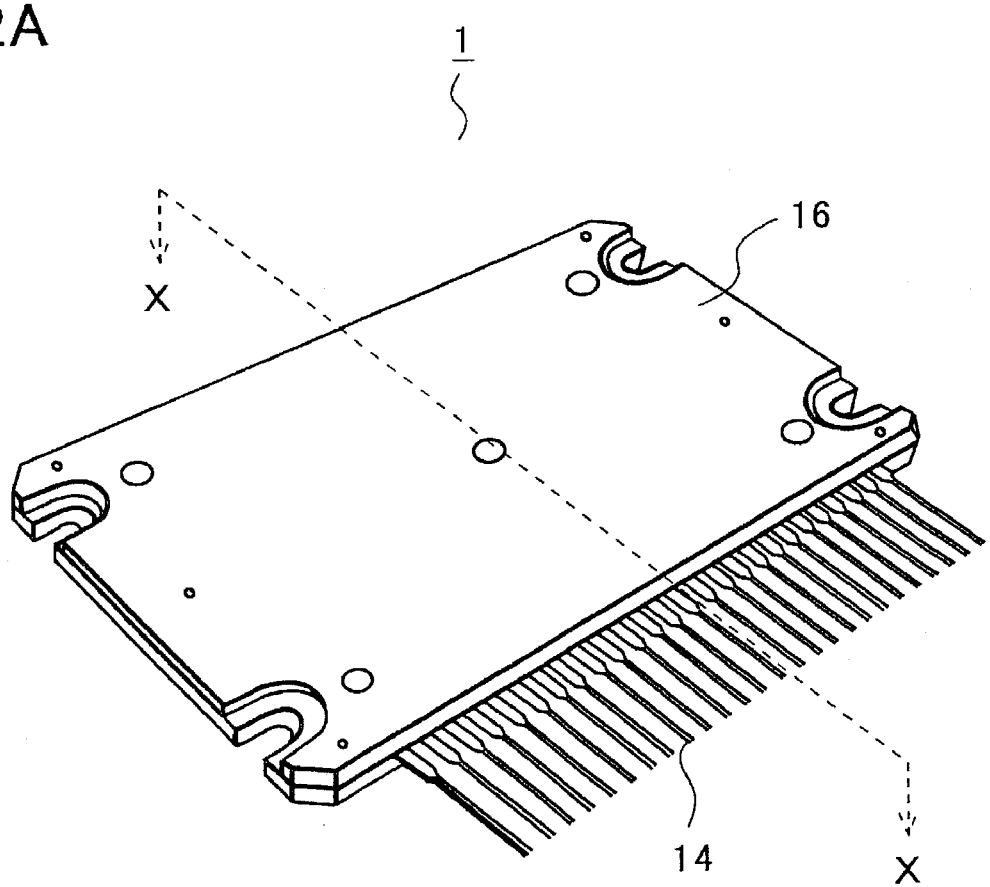
FIG. 12(A) is a perspective view and FIG. 12(B) is a sectional view of a hybrid integrated circuit device according to some preferred embodiments.

Another arrangement of a hybrid integrated circuit device sealed in an insulating resin shall now be described with reference to FIGS. 12(A)-(B). FIG. 12(A) is a perspective view of a hybrid integrated circuit device 1 and FIG. 12(B) is a sectional view along line X-X' of FIG. 12(A).

The preferred structure of hybrid integrated circuit device 1 shall now be described with reference to FIGS. 12(A)-(B). The illustrative hybrid integrated circuit device 1 shown in these Figures is sealed in a resin.

Insulating resin 16 preferably has a function of sealing a hybrid integrated circuit, including circuit elements 13, etc., that are disposed on the top surface of a circuit substrate 10. In regard to the type of insulating resin 16, a thermoplastic resin, which seals upon being injection molded, a thermosetting resin, which seals upon being transfer molded, etc., can be be employed.

Figure 12B:
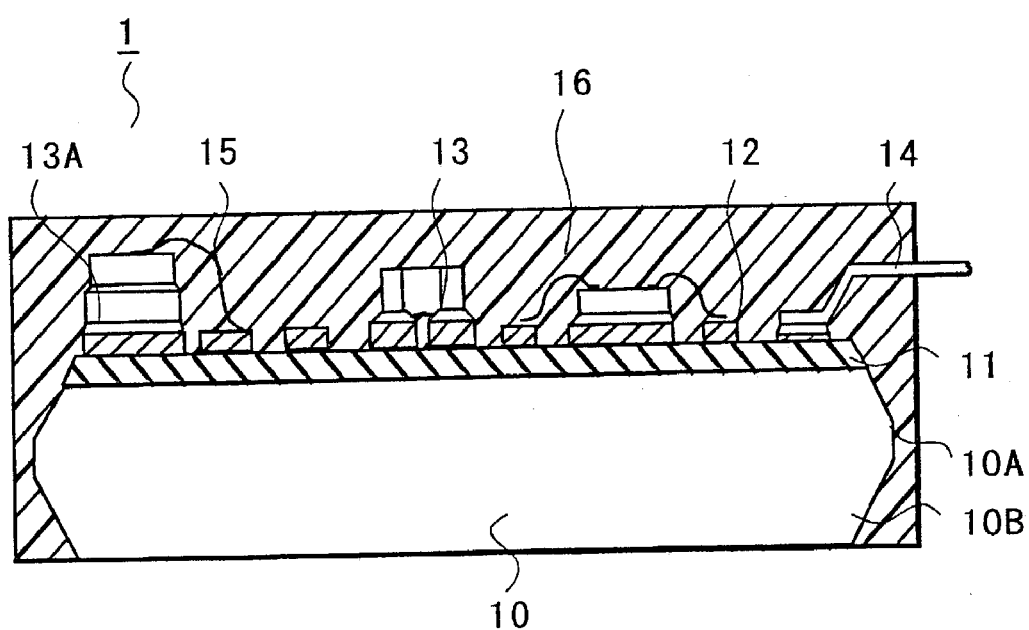

As shown in FIG. 12(B), a side face of circuit substrate 10 preferably has a vertical part 10A and an inclined part 10B. Preferably, the angle formed by the rear surface and inclined part 10B of circuit substrate 10 is an obtuse angle. Thus, when resin sealing is performed with the rear surface of circuit substrate 10 being exposed as shown in FIG. 12(B), the insulating resin 16 is preferably set around inclined parts 10B. As a result, an anchor effect can be provided between inclined parts 10B and the insulating resin 16. In the embodiment shown in FIGS. 12(B), upper inclined parts 10B are also formed along the side faces above the vertical part 10A and continuing toward the top surface of circuit substrate 10.

Figure 13A:
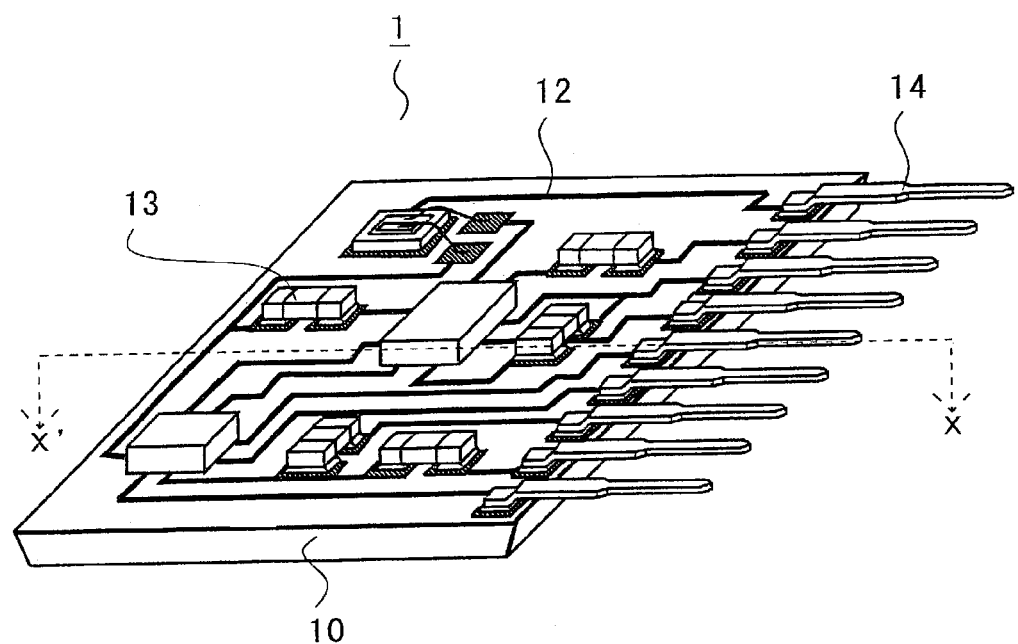
FIG. 13(A) is a perspective view and FIG. 13(B) is a sectional view of a hybrid integrated circuit device according to some preferred embodiments.

The preferred arrangement, etc., of the hybrid integrated circuit that is formed on circuit substrate 10 of this embodiment's hybrid integrated circuit device 1 will now be described with reference to FIGS. 13(A)-(B). FIG. 13(A) is a perspective view of hybrid integrated circuit device 1 and FIG. 13(B) is a sectional view along line X-X' of FIG. 13(A).

Figure 13B:
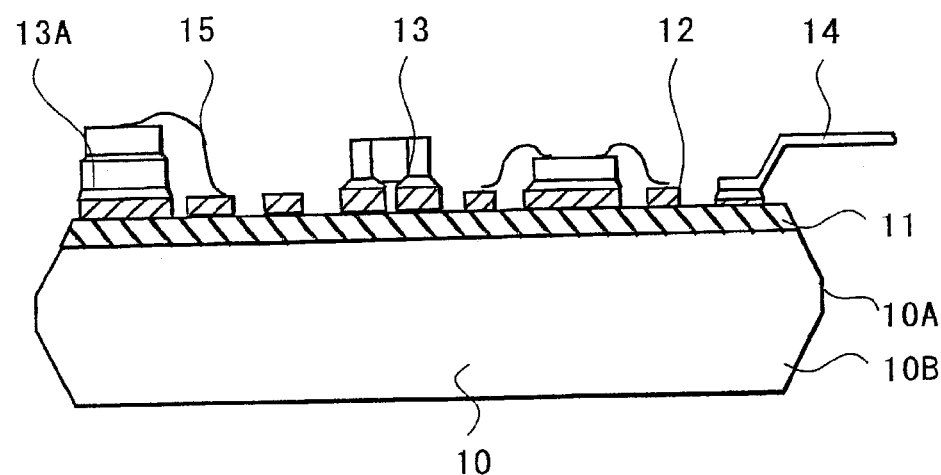

As shown in FIGS. 13(A)-(B), an illustrative hybrid integrated circuit device 1 can have the following arrangement. In this regard, the hybrid integrated circuit device 1 preferably includes, e.g., a circuit substrate 10 (formed of, e.g., a metal), an insulating layer 11 (formed, e.g., on a top surface of circuit substrate 10), a conductive pattern 12 (formed, e.g., on an insulating layer 11), circuit elements 13 (mounted, e.g., to predetermined positions on conductive pattern 12), etc. These preferred components shall now be described in detail with reference to some illustrative embodiments.

First, the circuit substrate 10 will now be described. In preferred embodiments, aluminum, copper and/or another metal is used for the material of the circuit substrate 10. In some embodiments, an alloy can be used for the material of circuit substrate 10. In various embodiments, any appropriate materials known to those in the art may be employed. In some preferred embodiments, a circuit substrate 10 that is formed of aluminum is employed. Preferably, both surfaces of the substrate have been subjected to an alumite treatment. In some illustrative embodiments, a side face of circuit substrate 10 is formed with inclined parts 10B that incline from the upper surface and the lower surface, respectively, and a vertical part 10A that extends between the inclined parts 10B.

Preferably, the inclined parts 10B are formed on the side faces of the circuit substrate 10 during the manufacturing method. In preferred embodiments, the circuit substrate 10 is manufactured by cutting and dividing a large-size substrate. In a first step, V-shaped or generally V-shaped grooves are preferably formed from the top surface and the rear surface of the substrate. Then, in a second step, to separate the substrate into individual substrates, the remaining thicknesses of the substrate above the V-shaped grooves are preferably removed starting from, preferably, the top surface. These V-shaped groove parts become the inclined parts 10B. An illustrative manufacturing method according to some illustrative embodiments for forming circuit substrates 10 shall be described below to demonstrate, by way of example, methods of manufacturing a hybrid integrated circuit device.

Second, the insulating layer 11 will now be described. Insulating layer 11 is preferably formed on the top surface of circuit substrate 10. Preferably, the insulating layer has a function of insulating the conductive pattern 12 and the circuit substrate. Preferably, the insulating layer 11 is also highly filled with alumina for actively transferring the heat generated from circuit elements 13 to the circuit substrate 10.

Third, the conductive pattern will now be described. The conductive pattern 12 is preferably disposed on the top surface of insulating layer 11. Preferably, it is formed with copper and/or another metal. In the preferred embodiments, the conductive pattern 12 is formed across substantially the entire or the entire top surface of circuit substrate 10. In some embodiments, the conductive pattern 12 is formed near one or more peripheral end parts of the circuit substrate. In some embodiments, the conductive pattern extends to within about 2 mm from one or more peripheral ends of circuit substrate 10. In some embodiments, the conductive pattern extends to within about 1 mm from one or more peripheral ends of circuit substrate 10, or even less than 1 mm in other embodiments.

In preferred embodiments, the conductive pattern 12 can be formed near the peripheral end parts of the circuit substrate 10 because of the method used in the partitioning of the circuit substrate 10. While some preferred methods of partitioning circuit substrate 10 shall be described in detail below, generally speaking, individual circuit substrates 10 are preferably separated from a large-size substrate by partitioning the metal substrate in a unique manner (e.g., with a cutter). In the related art example described above, margins near the peripheral end parts of circuit substrate 10 were required because the circuit substrates were partitioned by a press. On the other hand, preferred embodiments herein enable the margins to be eliminated and a conductive pattern 12 to be formed over substantially the entire or the entire top surface of circuit substrate 10.

Fourth, circuit elements 13 will now be described. Preferably, the circuit elements 13 are mounted by solder or brazing material onto predetermined locations of conductive pattern 12. In various embodiments, passive elements and/or active elements can be employed generally as circuit elements 13. In some cases where a power transistor is to be mounted, the transistor is preferably mounted onto a heat sink that is affixed to the conductive pattern. With the preferred embodiments of the invention, a circuit element 13 can be positioned at substantially any location upon the circuit substrate 10. That is, a circuit element 13 can be positioned near a peripheral end part of circuit substrate 10. For example, a circuit element can be positioned on the top surface of circuit substrate within about 2 mm from a peripheral end part of circuit substrate 10, or within about 1 mm from a peripheral end part of a circuit substrate, or even less.

In some embodiments, as shown in FIG. 13(A), a heat sink 13A is mounted to a predetermined location of conductive pattern 12. A power transistor can be mounted on a top surface of this heat sink and the power transistor can be electrically connected with conductive pattern 12 by, e.g., metal wires 15. In these cases, the heat sink 13A can be positioned at substantially any location of circuit substrate 10. Specifically, heat sink 13A can be positioned even near a peripheral end part within, e.g., about 2 mm from a peripheral end of circuit substrate 10, or even less. Once again, the heat sink 13 can be formed up to near the peripheral end parts of circuit substrate 10 because of the preferred methods of partitioning the circuit substrate 10 according to the preferred embodiments.

As explained above, while some preferred methods of partitioning circuit substrate 10 shall be described in detail below, generally speaking, individual circuit substrates 10 are preferably separated from a large-size substrate by partitioning the metal substrate in a unique manner. In the related art example described above, margins near the peripheral end parts of circuit substrate 10 were required because the circuit substrates were partitioned by a press. Furthermore, since a heat sink 13, onto which a power transistor is mounted, had the greatest height among the circuit elements 13, it could not be positioned at a peripheral part of circuit substrate 10. The preferred embodiments of the present invention enable the margins to be eliminated and enable, e.g., a heat sink 13A to be mounted at substantially any location on the top surface of circuit substrate 10. In various embodiments, this same substantially-any-location benefit can be made available to passive elements, active elements and/or any other circuit elements 13.

In some embodiments, leads 14 are affixed to pads formed of conductive pattern 12 and have a function of performing input and output with respect to the exterior. In addition, a power transistor, etc., can be mounted face-up and electrically connected with the conductive pattern 12 by, e.g., metal wires 15. Furthermore, an overcoat of resin, etc., can be applied to locations of the conductive pattern 12 where an electrical connection is not made.

In preferred embodiments, the arrangement of hybrid integrated circuit device 10 described above provides one or more, preferably all, of the following effects.

First, since conductive pattern 12 can be formed up to near the end parts of circuit substrate 10, in cases where the same circuit as that of a prior-art example is formed, the size of the entire hybrid integrated circuit device can be made small.

Second, since the circuit elements 13 can be positioned up to near the end parts of circuit substrate 10, the degree of freedom in designing the electrical circuit can be improved. Furthermore, since the density of the pattern can be improved, in cases where the same circuit as that of an existing related art example is formed, the size of the entire hybrid integrated circuit device can be reduced.

Third, since an anchor effect is provided between inclined parts 10B of the circuit substrate 10 and the insulating resin 16, a separation of the circuit substrate 10 from insulating resin 16 can be prevented.

Fourth, in preferred embodiments, the parts where the side faces of circuit substrate 10 continue to the rear surface are formed to have an obtuse angle without a rounded shape. In this manner, in some embodiments, in a step of using a mold die for sealing in insulating resin 16 with the rear surface of the circuit substrate being exposed, insulating resin 16 can be prevented from entering into gaps between the mold die and the circuit substrate 10. Insulating resin 16 can thus be prevented from becoming attached to the rear surface of circuit substrate 10. Thus, in preferred embodiments, the corner between the rear surface of the substrate 10 and the inclined part 10B is not rounded in a manner that may facilitate resin flow therearound.

4. Fourth Embodiment (Showing, e.g., Illustrative Methods)

Some preferred methods for manufacturing a hybrid integrated circuit device, such as, e.g., that described with respect to the third embodiment, shall now be described with reference to FIGS. 14-23.

In some preferred embodiments, a hybrid integrated circuit device manufacturing method can include at least some, preferably all, of the following steps: preparing a metal substrate 10A' having an insulating layer 11 formed on a top surface thereof; forming a plurality of conductive patterns 12 on the top surface of insulating layer 11; forming grooves 20 in a lattice form on a top surface and a rear surface of the metal substrate 10B'; mounting hybrid integrated circuits onto conductive patterns 12; and separating individual circuit substrates 10 by separating the metal substrate 10B' at the locations where grooves 20 are formed.

Figure 14:
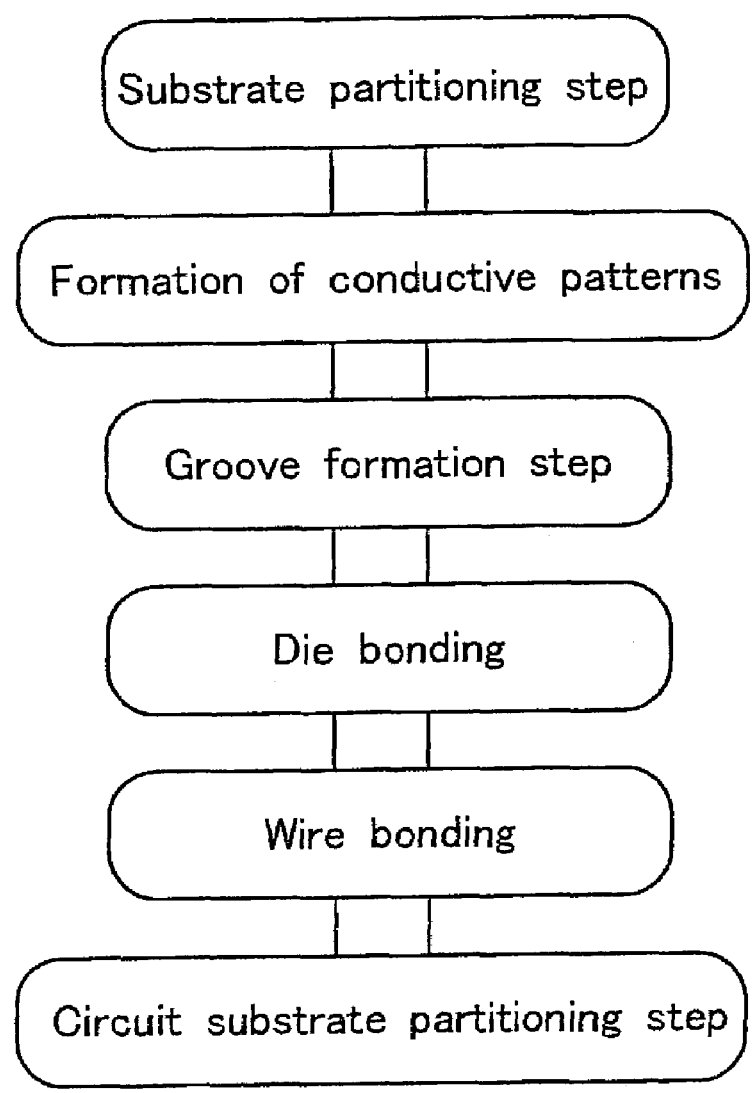
FIG. 14 is a flowchart of a hybrid integrated circuit device manufacturing method according to some illustrative embodiments.

The preferred overall process of this embodiment shall be described with reference to the flowchart of FIG. 14. In this embodiment, a hybrid integrated circuit device is preferably manufactured by the following steps. That is, a hybrid integrated circuit device is preferably manufactured using at least some, preferably all, of the following steps: cutting and dividing a large-size substrate 10A' (e.g., a metal substrate) into mid-size substrates 10B' by partitioning the large-size substrate 10A'; forming conductive patterns 12 of a plurality of hybrid integrated circuits on a top surface of each mid-size substrate 10B'; forming first grooves 20A and second grooves 20B in lattice form on the top surface and the rear surface of each mid-size substrate 10B'; performing die bonding to mount circuit elements 13 onto conductive patterns 12; performing wire bonding; separating individual circuit substrates 10 by partitioning metal substrate 10B' at locations where grooves 20A/20B have been formed, etc. Then, the partitioned circuit substrates 10 are preferably sealed in an insulating resin. The preferred embodiments of each of these respective steps will be described below.

First Step (See FIG. 15):

In this step, a large-size substrate 10A' is preferably partitioned to form mid-size metal substrates 10B'.

Figure 15A:
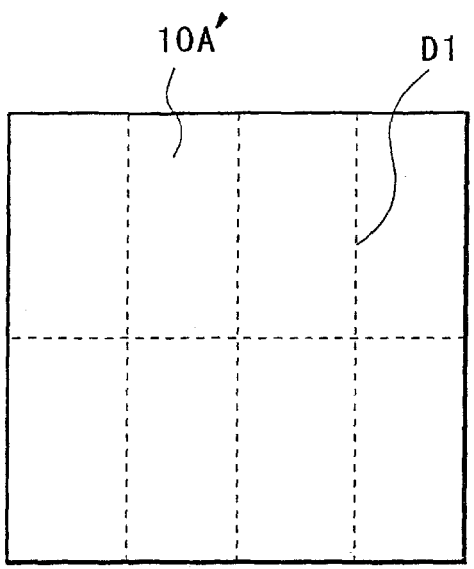
FIG. 15(A) is a plan view.

First, a large-size metal substrate 10A' can be prepared as shown in FIG. 15(A). The size of large-size substrate 10A' can be, for example, approximately 1 m$^2$ (1 square meter) or more. However, the size of the substrate 10A' can vary based on circumstances. In some embodiments, the substrate 10A' can be an aluminum substrate, both surfaces of which have been subject to alumite treatment. Preferably, an insulating layer is provided on the top surface of metal substrate 10A'. A copper foil, which is to become conductive patterns, is preferably formed on the top surface of the insulating layer.

Figure 15B:
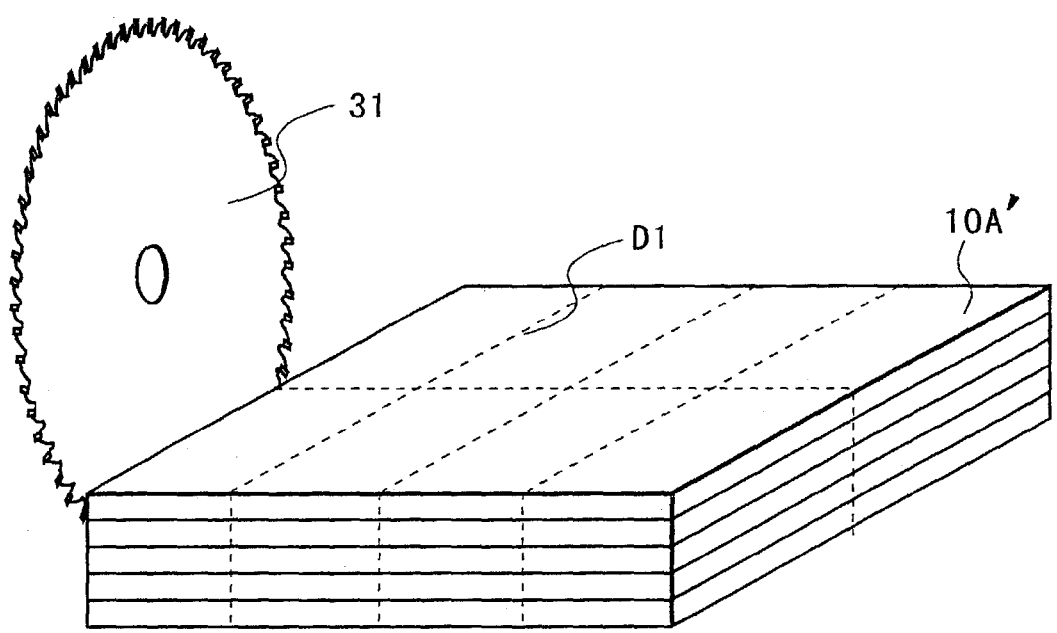
FIG. 15(B) is a perspective view.

Next, as shown in FIG. 15(B), the metal substrate 10A' is partitioned along dicing lines D1 by a cutter 31. In the illustrative embodiment, the cutter 31 includes a rotary saw. However, various other cutters can be used in other embodiments, such as, e.g., knives, blades, scissors, guillotines, shears, reciprocated cutters, rotary cutters, and/or various other cutters. In the illustrated embodiment, a plurality of sheets of metal substrate 10A' can be overlapped and partitioned simultaneously. Preferably, the saw 31 partitions metal substrate 10A' along dicing lines D1 while rotating at high speed. In this illustrated example, a large-size metal substrate 10A' with a generally square shape is partitioned into eight parts along dicing lines D1 and made into elongated mid-sized metal substrates 10B'. In the illustrated example, the shape of a mid-sized metal substrate 10B' is such that the length of the long side is about twice the length of the short side.

Figure 15C:
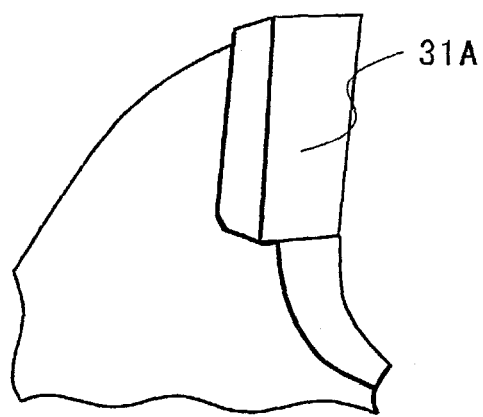
FIG. 15(C) is an enlarged view showing aspects of a hybrid integrated circuit device manufacturing method according to some illustrative embodiments.

While a variety of cutters 31 could be used, in some preferred embodiments, a rotary saw having features as shown in FIG. 15(C) is provided. In that regard, a preferred shape, etc., of a blade edge of a saw 31 is shown in FIG. 15(C). FIG. 15(C) is an enlarged view of the vicinity of a blade edge 31A of the saw 31. As shown, the end part of blade edge 31A is formed to be flat. Preferably, a diamond material is embedded therein. By rotating a saw with such blade edges at a high speed, the metal substrate 10A' can be readily partitioned along dicing lines D1. Once again, various other embodiments can employ different cutters.

Preferably, etching can be performed on a mid-sized metal substrate 10B' manufactured by this step to remove the copper foil partially and thereby form conductive patterns. Though the number of conductive patterns depends on the size of metal substrate 10B' and the size of a hybrid integrated circuit, conductive patterns that form, for example, several dozen to several hundred hybrid integrated circuits can be formed on a single metal substrate 10B'.

Figure 16A:
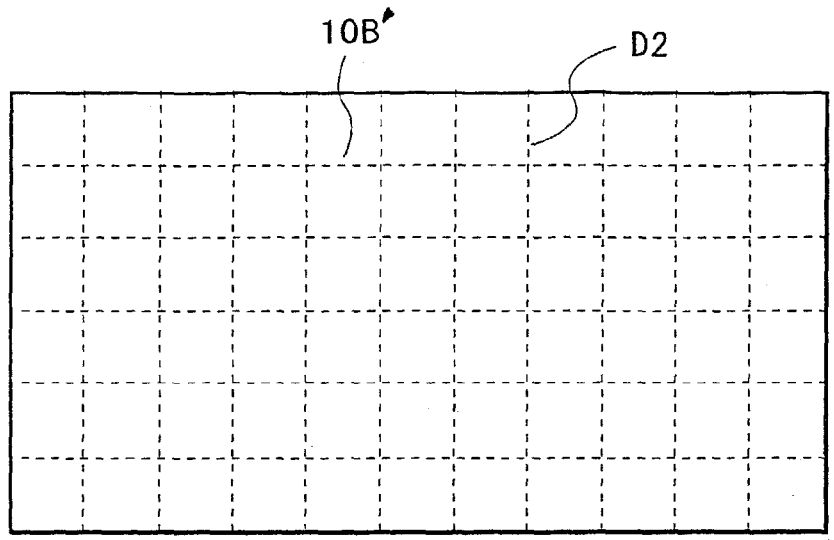
FIG. 16(A) is a plan view.
Figure 16B:
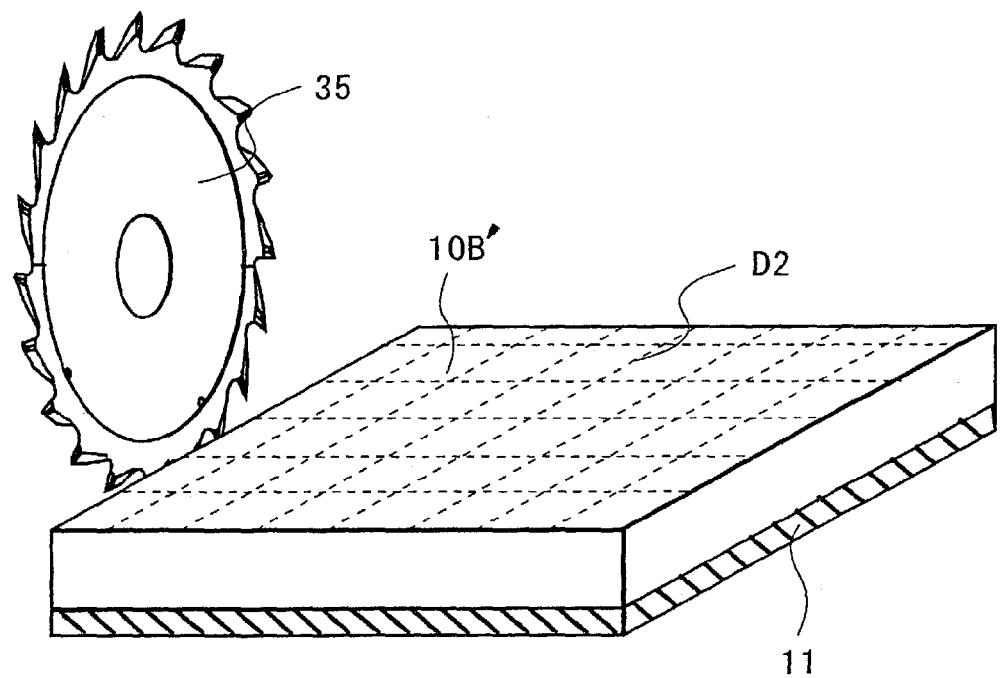
FIG. 16(B) is a perspective view.
Figure 16C:
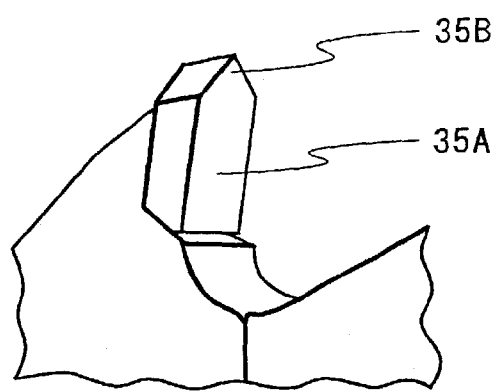
FIG. 16(C) is an enlarged view showing aspects of a hybrid integrated circuit device manufacturing method according to some illustrative embodiments.

Second Step (See FIGS. 16-17):

In this step, first grooves 20A and second grooves 20B are preferably formed in lattice form on the top and rear surfaces of the mid-sized metal substrate 10B'. FIG. 16(A) is a plan view of a mid-sized metal substrate 10B' that had been partitioned in a prior step. FIG. 16(B) is a perspective view, showing an illustrative condition in which grooves can be formed in the substrate 10A' using a V-cut saw 35. FIG. 16(C) is an enlarged view of blade edge 35A of the blade 35 shown in FIG. 16(B).

With reference to FIGS. 16(A)-(B), a V-cut saw 35 can be rotated at a high speed to form first grooves 20A and second grooves 20B in the top surface and rear surface of the metal substrate along dicing lines D2. In preferred embodiments, the dicing lines D2 are situated in a lattice form. In preferred embodiments, the dicing lines D2 correspond to boundary lines of individual conductive patterns formed on insulating layer 11. While in the illustrated embodiment, a single cutter, e.g., saw 35, is depicted, various embodiments can employ a plurality of cutters, if desired.

FIG. 16(C) is an enlarged view of the vicinity of a blade edge 35A of the saw 35 illustrating a preferred shape of the V-cut saw 35. In this regard, the V-cut saw 35 is preferably provided with a plurality of blade edges 35A having a shape substantially as shown. Preferably, the shape of a blade edge 35A corresponds to a shape of a groove to be provided in the metal substrate 10A'. In the illustrated example, grooves with a V-shaped cross section are formed on both top and rear surfaces of the metal substrate. The shape of a blade edge 35A is preferably also substantially a V-shape. Preferably, a diamond material is embedded in blade edge 35A. While in the illustrated embodiment, a single cutter can be used to form grooves 20A and 20B, various embodiments can employ separate cutters for the grooves 20A and 20B (such as, e.g., in embodiments where the grooves 20A and 20B are to have dissimilar dimensions).

As shown, a flat part 35B is preferably formed at the leading end of the blade edge 35A of the V-cut saw 35. That is, leading end of the blade edge 35A is preferably not formed to have a sharp edge but is formed to have a flat part. The first grooves 20A and second grooves 20B that are formed by high-speed rotation of V-cut saw 35 are thus formed to have shapes corresponding to that of the flat part 35B.

In some embodiments, the use of such a flat part 35B at the leading end of the blade edge 35A can have some benefits. For example, by forming the blade edge 35A to be flat, the wear of V-cut saw 35 can be reduced and the grooves 20 can be formed more efficiently. During the formation of first grooves 20A on a surface on which resin layer 11 is formed, since resin layer 11 is often very hard, if the tip of blade edge 35A is made too sharp, a large stress can act on the sharp tip part and the tip part can wear down at an early stage. On the other hand, by forming a flat part 35B at blade edge 35A, the tip part of blade edge 35A can be made to wear more uniformly and more gradually. As a result, an early wear of blade edge 35A can be prevented. Because this helps to increase the cutting performance of the V-cut saw 35, it also helps to prevent the formation of cracks in resin layer 11 in the process of forming first grooves 20A on the surface on which resin layer 11 is formed.

The preferred shape of metal substrate 10B' in which grooves 20 have been formed shall now be described with reference to FIGS. 17(A)-(B). In that regard, FIG. 17(A) is a perspective view of metal substrate 10B' with which grooves have been formed by cut saw 31 and FIG. 17(B) is a sectional view of metal substrate 10B'.

Figure 17A:
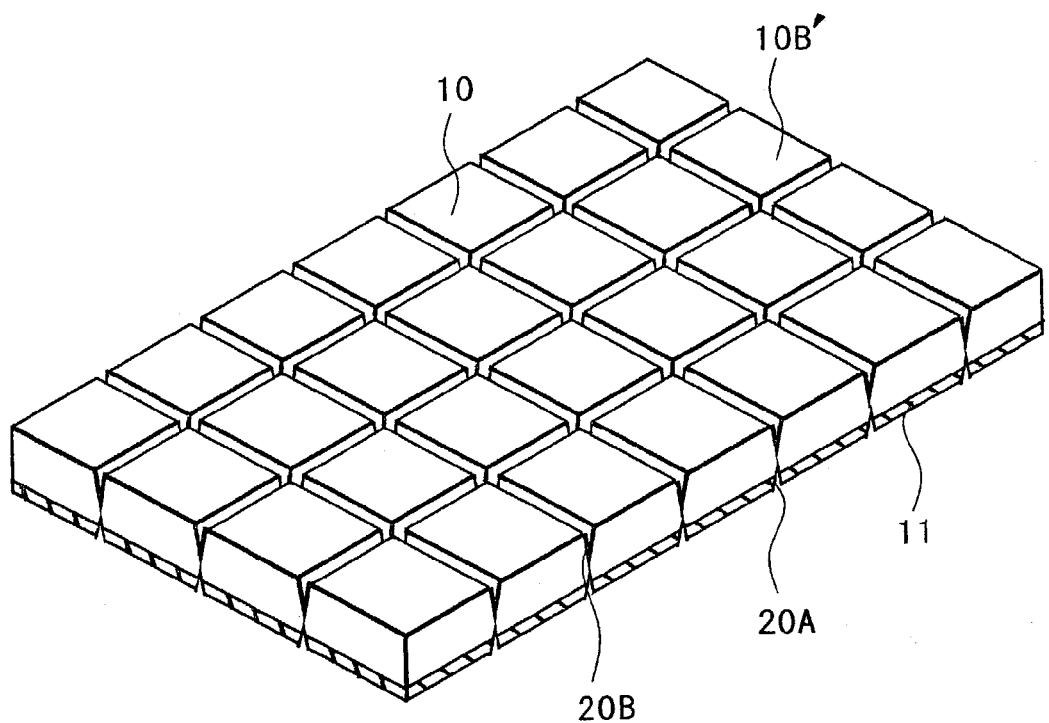
FIG. 17(A) is a perspective view and FIG. 17(B) is a sectional view showing aspects of a hybrid integrated circuit device manufacturing method according to some illustrative embodiments.
Figure 17B:
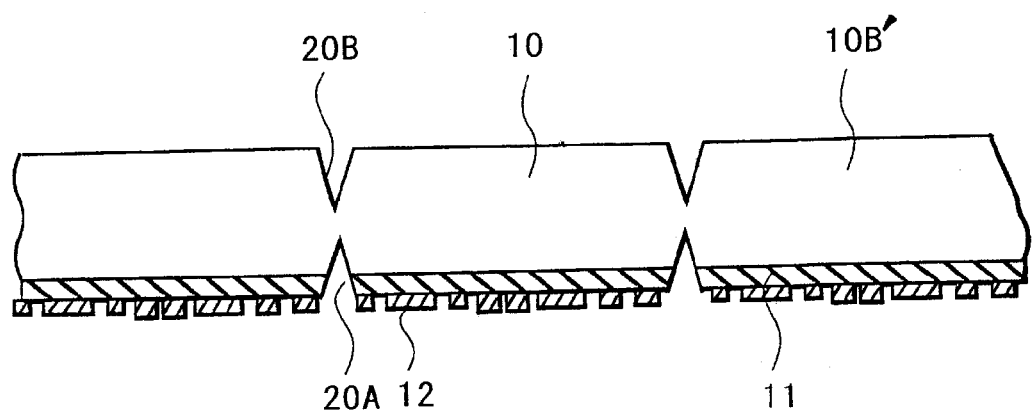

As shown in FIG. 17(A), first grooves 20A and second grooves 20B are formed in lattice form on the top surface and rear surface of metal substrate 10B'. In this embodiment, the lattice positions of first grooves 20A and second grooves 20B preferably correspond accurately to each other. With the illustrated embodiment, since the grooves are formed using a V-cut saw 35 having V-shaped blade edges 35A, the grooves 20 have a V-shaped cross section. The central lines of grooves 20 (e.g., at their apexes) correspond to the boundaries of the individual substrates, and the outer edges of the grooves 20A correspond to the boundary lines of the conductive patterns 12 that make up the individual circuits formed on insulating layer 11. In the illustrated embodiment, first grooves 20A are formed on the surface on which resin layer 11 is formed and second grooves 20B are formed on the opposite surface.

The preferred shape, etc., of a groove 20 shall now be described with reference to FIG. 17(B). Here, a groove 20 is preferably formed to have a substantially V-shaped cross section. The depth of each of first grooves 20A and second grooves 20B is preferably made shallower than half the thickness of metal substrate 10B'. In the present step, the metal substrate 10B' is preferably not partitioned into individual circuit substrates 10. That is, the individual circuit substrates 10 are preferably connected at remaining thickness parts of the metal substrate 10B' corresponding to the locations of the grooves 20. Thus, until partitioned into the individual circuit substrates 10, the metal substrate 10B' can be handled as a single, sheet-like object. Preferably, if "burrs" are formed in this step, the "burrs" are removed, such as, e.g., by performing high-pressure washing.

Third Step (See FIGS. 18-20):

In this step, circuit elements 13 are preferably mounted onto conductive patterns 12 and electrical connections are made between circuit elements 13 and conductive patterns 12.

Figure 18:
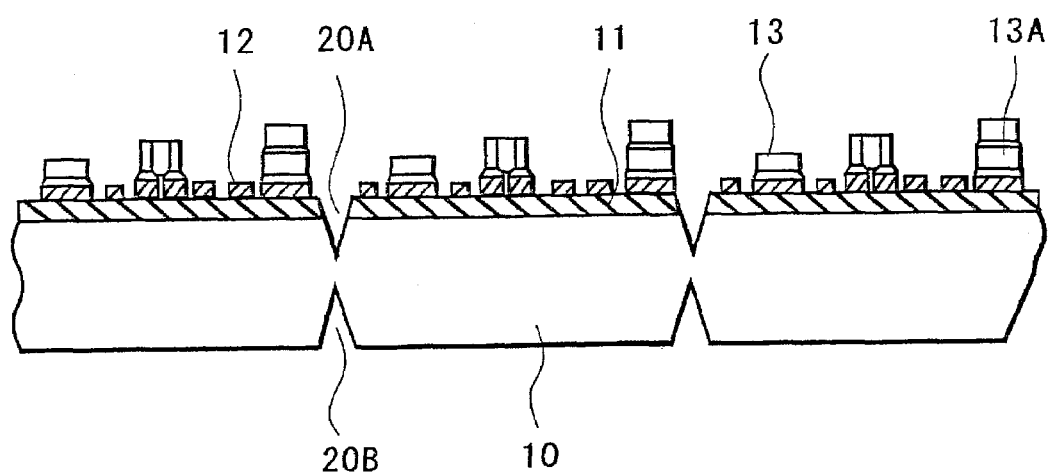
FIG. 18 is a sectional view showing aspects of a hybrid integrated circuit device manufacturing method according to some illustrative embodiments.

A preferred die bonding step, in which circuit elements 13 are mounted onto conductive patterns 12 shall now be described with reference to FIG. 18. FIG. 18 is a sectional view showing a condition in which circuit elements 13 have been mounted onto conductive patterns 12. Preferably, the circuit elements 13 are mounted onto predetermined locations of conductive patterns 12 by, for example, soft solder or other soldering material. As mentioned above, conductive patterns 12 are preferably formed near the peripheral end parts of circuit substrates 10. The circuit elements 13 can thus also be mounted near the peripheral end parts of circuit substrates 10 as well. Also, a heat sink 13A, on the upper surface of which a power transistor is mounted, is a circuit element that is typically higher in height in comparison to other circuit elements. Thus, with a hybrid integrated circuit device manufacturing method using a press as in the related art, a heat sink 13A could not be positioned near a peripheral end part of a circuit substrate 10. As shall be described below, in some preferred embodiments of the present invention, circuit substrates 10 can be partitioned individually using, e.g., a circular cutter. Thus, a heat sink 13A and/or another circuit element 13 with increased height can even be positioned near a peripheral end part of a circuit substrate 10.

Figure 19:
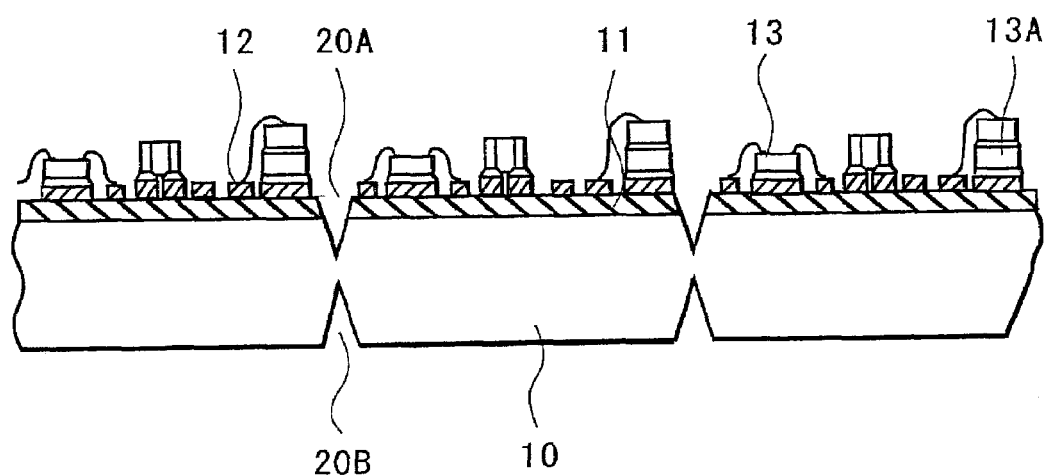
FIG. 19 is a sectional view showing aspects of a hybrid integrated circuit device manufacturing method according to some illustrative embodiments.

A preferred wire bonding step in which electrical connections are made between circuit elements 13 and the conductive patterns 12 shall now be described with reference to FIG. 19. FIG. 19 is a sectional view showing the condition where circuit elements 13 are electrically connected with the conductive pattern 12. Here, wire bonding is preferably performed in a batch process on, for example, several dozen to several hundred hybrid integrated circuits formed on a single metal substrate 10B'.

Figure 20:
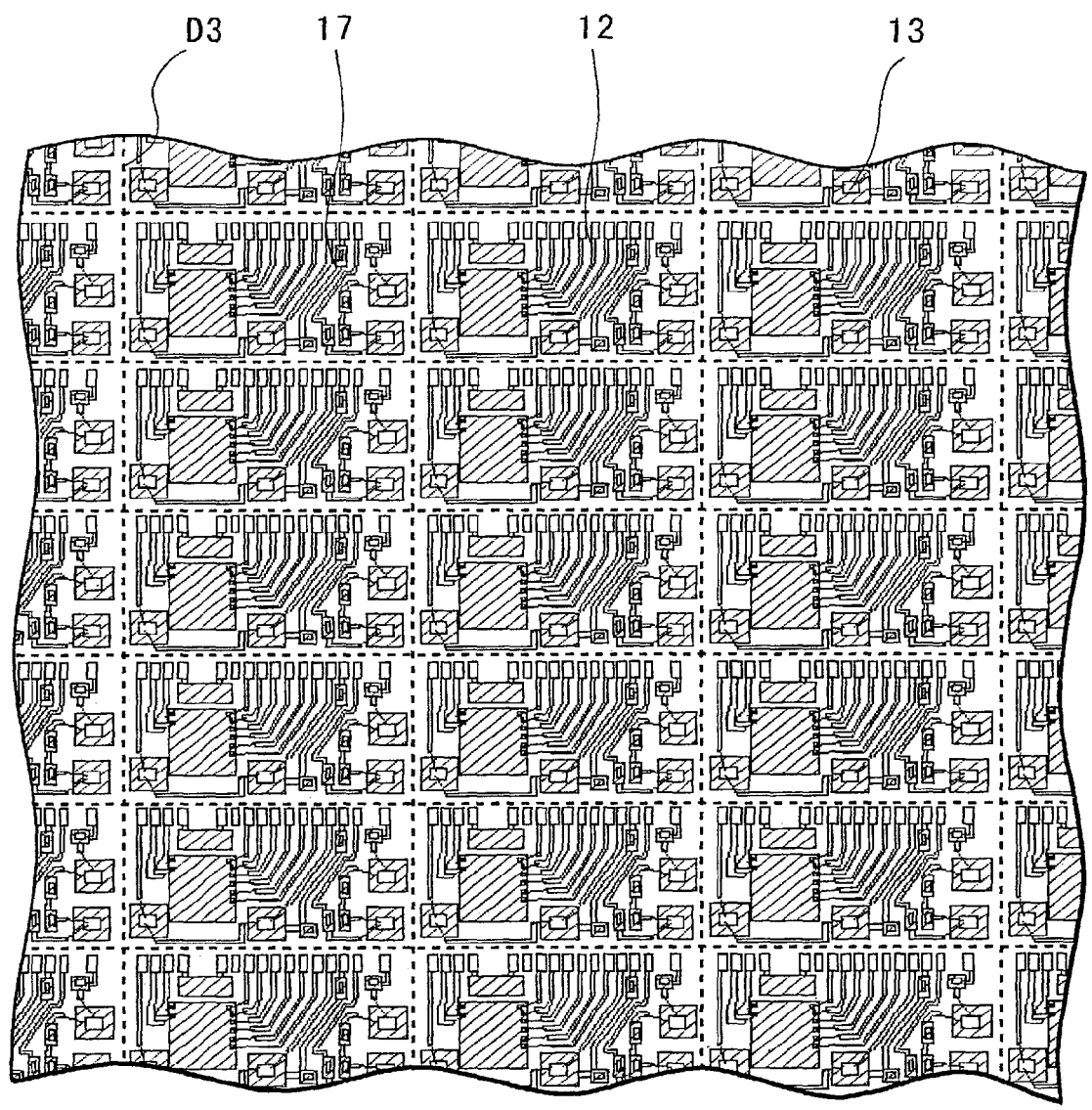
FIG. 20 is a plan view showing aspects of a hybrid integrated circuit device manufacturing method according to some illustrative embodiments.

Illustrative hybrid integrated circuits that have been formed on metal substrate 10B' shall now be described specifically with reference to FIG. 20. FIG. 20 is a plan view of a part of hybrid integrated circuits 17 formed on metal substrate 10B'. In preferred embodiments, as depicted by the wavy line edges, an even greater number of hybrid integrated circuits 17 are preferably formed. As shown by dotted lines in FIG. 9, the substrate 10B' can be partitioned into individual circuit substrates 10 along dicing lines D3. As depicted in this illustrative Figure, the conductive patterns 12 that form the individual hybrid integrated circuits can be formed very close to the dicing lines D3. In this manner, the conductive patterns 12 can be formed over substantially the entire or the entire the top surface of the substrate 10B'. As also illustrated, heat sinks 13A and other circuit elements 13 can also be disposed at peripheral parts of the hybrid integrated circuits.

In the preferred embodiments described above, hybrid integrated circuits were formed in a batch on a top surface of a substrate 10B' having an elongated shape. In some embodiments, if, e.g., there are restrictions of the manufacturing device for performing the die bonding or wire bonding, the substrate 10B' can be partitioned into desired sizes in a step prior to the present step. In one illustrative example, a metal substrate having a square shape can be obtained by partitioning the metal substrate 10B' in two pieces in a step prior to the present step.

Figure 21:
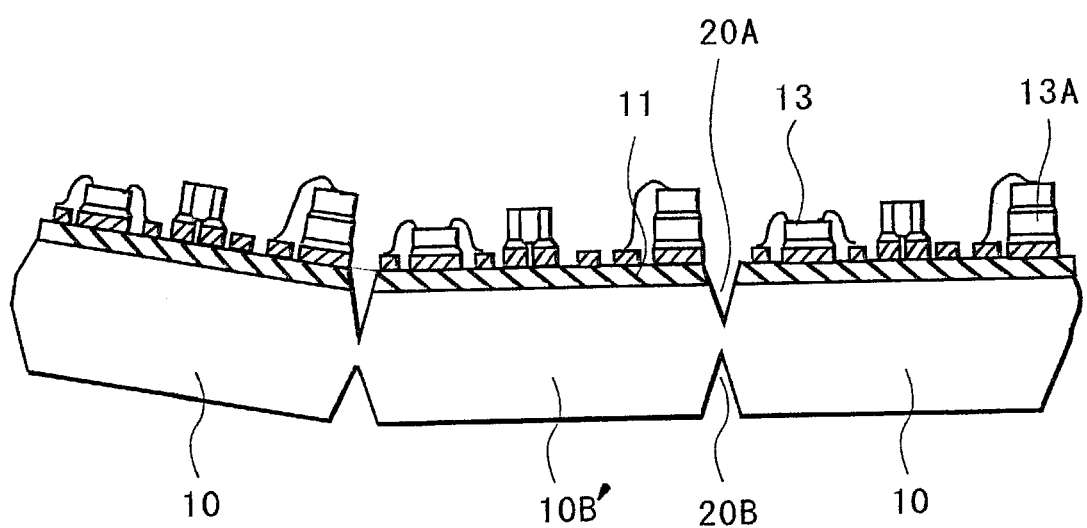
FIG. 21 is a sectional view showing aspects of a hybrid integrated circuit device manufacturing method according to some illustrative embodiments.
Figure 22A:
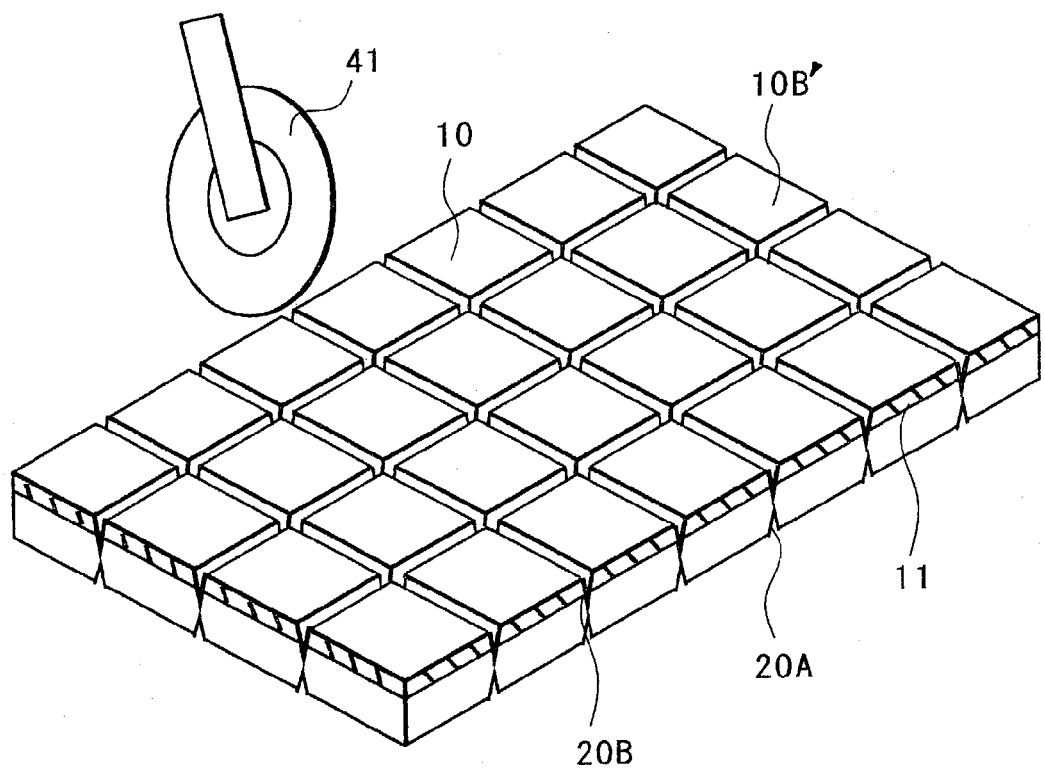
FIG. 22(A) is a perspective view and FIG. 22(B) is a sectional view showing aspects of a hybrid integrated circuit device manufacturing method according to some illustrative embodiments.
Figure 22B:
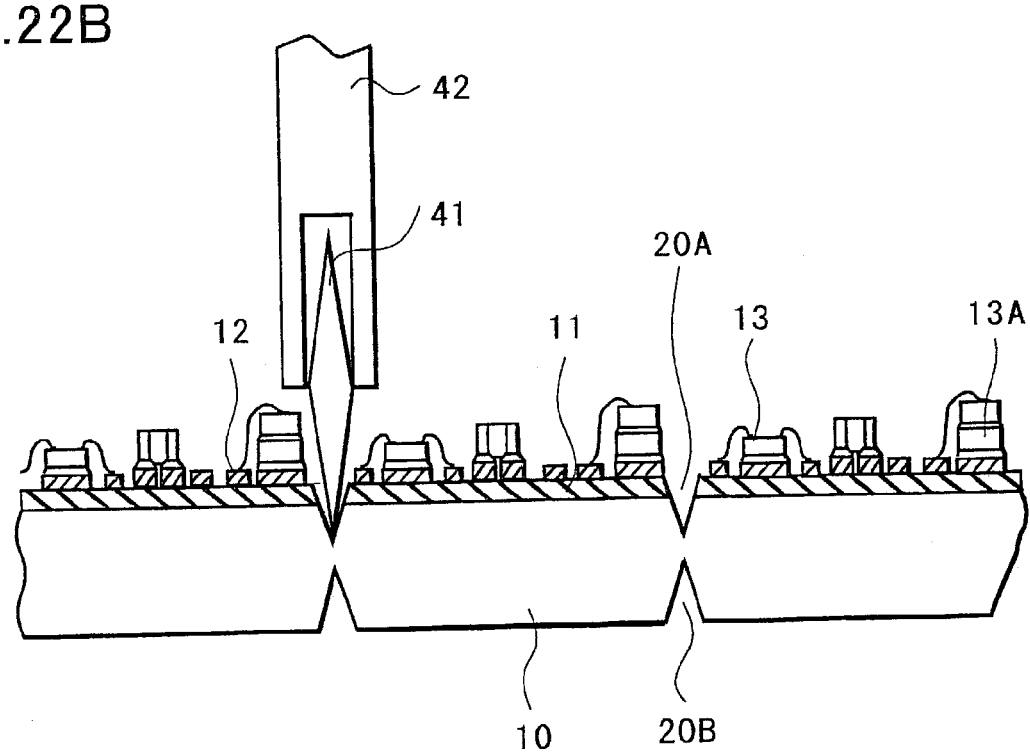

Fourth Step (See FIGS. 21-22):

In this step, metal substrate 10B' is preferably partitioned at parts where grooves 20 have been formed to thereby separate metal substrate 10B' into individual circuit substrates 10. FIG. 21 is a sectional view showing one illustrative method of partitioning the substrate. In this illustrative method, the metal substrate 10B' is bent to partition it into individual circuit substrates 10. FIG. 22(A) is a perspective view showing another illustrative method of partitioning the substrate into individual circuit substrates 10 using a circular cutter 41. FIG. 22(B) is a sectional view of FIG. 22(A). Although not shown in FIG. 22(A), a plurality of hybrid integrated circuits can be already formed on insulating layer 11.

The preferred method of bending a metal substrate 10B' to partition it into individual circuit substrates 10 shall now be described with reference to FIG. 21. With this method, the metal substrate 10B' is preferably bent at a location where a first groove 20A and a second groove 20B have been formed to effect partitioning. Since a location where a first groove 20A and a second groove 20B have been formed is connected only by a thickness part where a groove 20 is not formed, by bending at this location, separation of this connected part can be readily performed. Preferably, the method is carried out in a manner to avoid damaging the electrical circuit formed on the top surface of metal substrate 10B'. For example, the partial bending of metal substrate 10B' is preferably performed from the rear surface to avoid damaging the electrical circuit. In another examples, the substrate can be bent downwardly (e.g., opposite to that shown in FIG. 21) to effect separation.

The preferred method of partitioning a metal substrate 10B' by means of a circular cutter 41 shall now be described with reference to FIGS. 22(A)-(B). As shown in FIG. 22(A), circular cutter 41 preferably force-cuts the metal substrate 10B' along dicing lines D3. In this manner, the metal substrate 10B' can be readily partitioned into individual circuit substrates 10. The circular cutter 41 preferably force-cuts the part of the thickness part of metal substrate 10B' between the grooves 20A and 20B corresponding to the central lines of grooves 20.

The preferred details of circular cutter 41 shall now be described with reference to FIG. 22(B). The circular cutter 41 preferably has the shape of a circular disk. Preferably, as shown in FIG. 22(B), the peripheral edge part is formed into an acute angle. Preferably, the central part of circular cutter 41 is fixed to a supporting part 42 in a manner enabling free rotation of circular cutter 41 (such as, e.g., so as to rotate about a central axis). While the above-described saw 31 cut metal substrate 10B' while being rotated at high speed by a driving force (such as, e.g., via a drive motor or the like), the circular cutter 41 is preferably not driven by a driving force. Preferably, the circular cutter 41 freely rotates such that it rotates as it is moved along a dicing line D3 while a part of circular cutter 41 is pressed against metal substrate 10B' (e.g., due to the contact therebetween).

The preferred details of the partitioning of the metal substrate 10B' by a circular cutter 41 shall now be described with reference to FIG. 22(B). As mentioned above, in preferred embodiments a heat sink 13A and/or another circuit element 13 with some height can be positioned at a peripheral part of circuit substrate 10. The position of a heat sink 13A may thus be close to a dicing line D3 as shown in FIG. 10. The position of a supporting part 42 can be set so that supporting part 42 will not contact the heat sink 13A in such a case.

Figure 23:
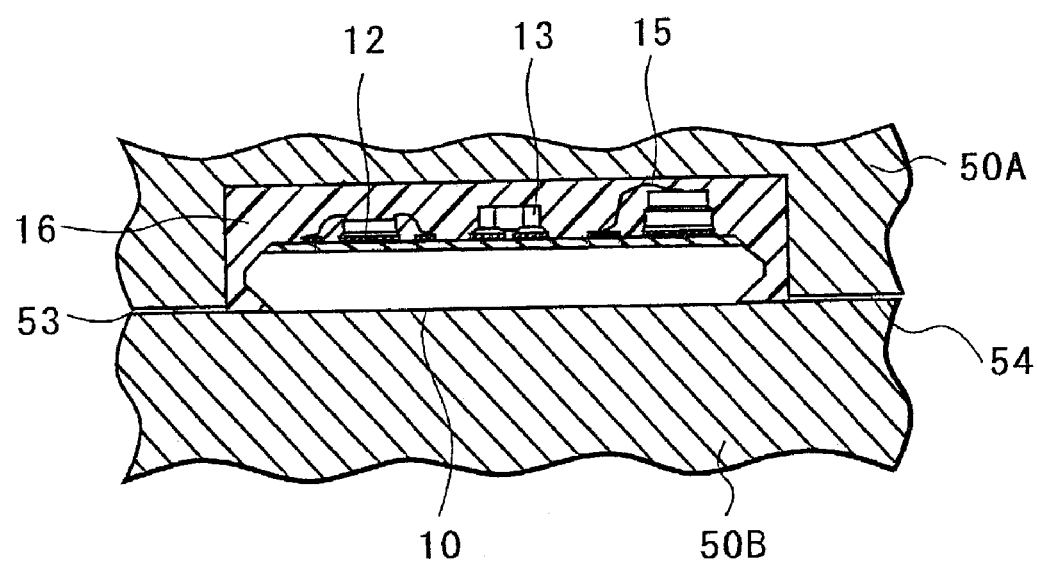
FIG. 23 is a sectional view showing aspects of a hybrid integrated circuit device manufacturing method according to some illustrative embodiments.
Figure 24A:
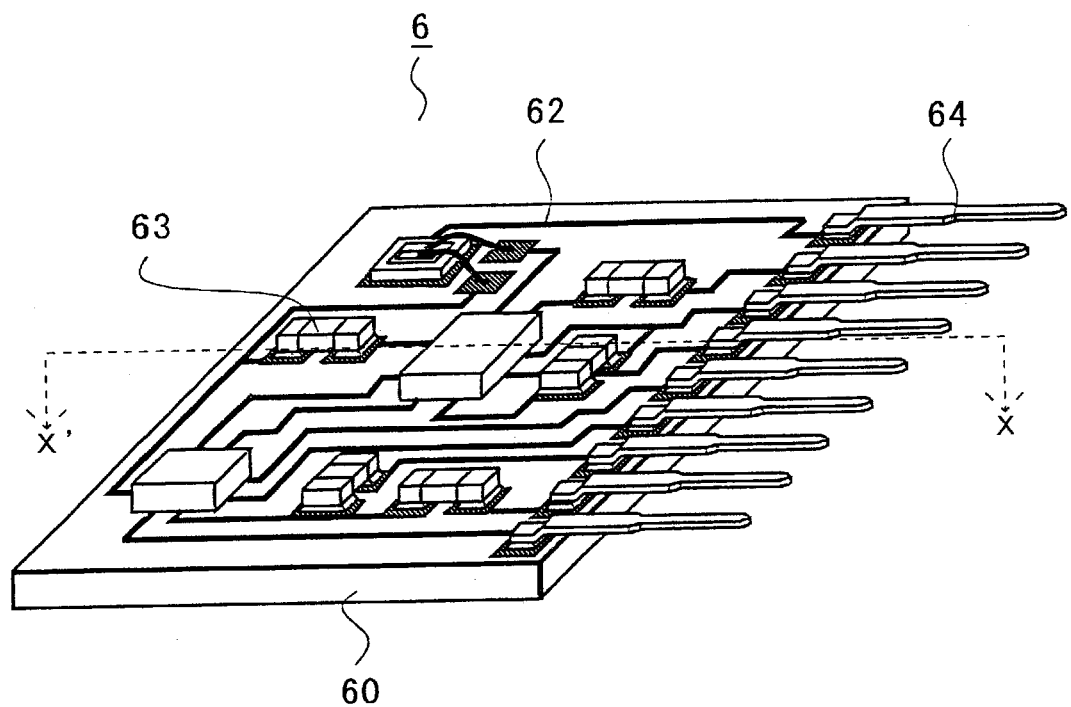
FIG. 24(A) is a perspective view and FIG. 24(B) is a sectional view for explaining a hybrid integrated circuit device in the related art.
Figure 24B:
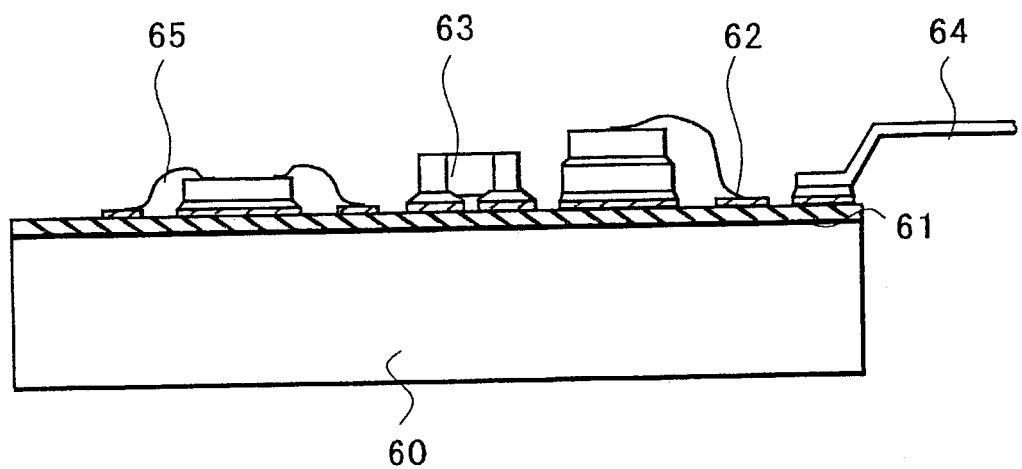
Figure 25A:
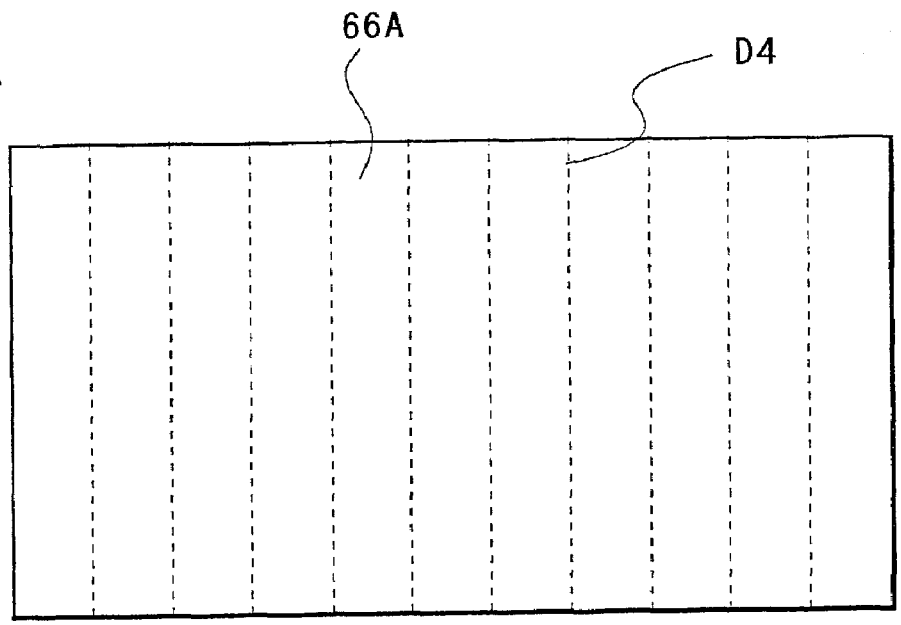
FIG. 25(A) is a plan view and FIG. 25(B) is a sectional view for explaining a hybrid integrated circuit device manufacturing method in the related art.
Figure 25B:
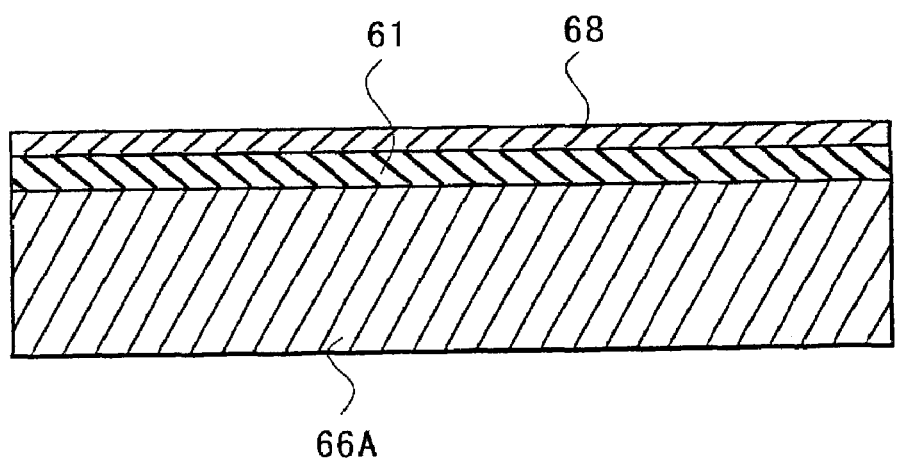
Figure 26A:
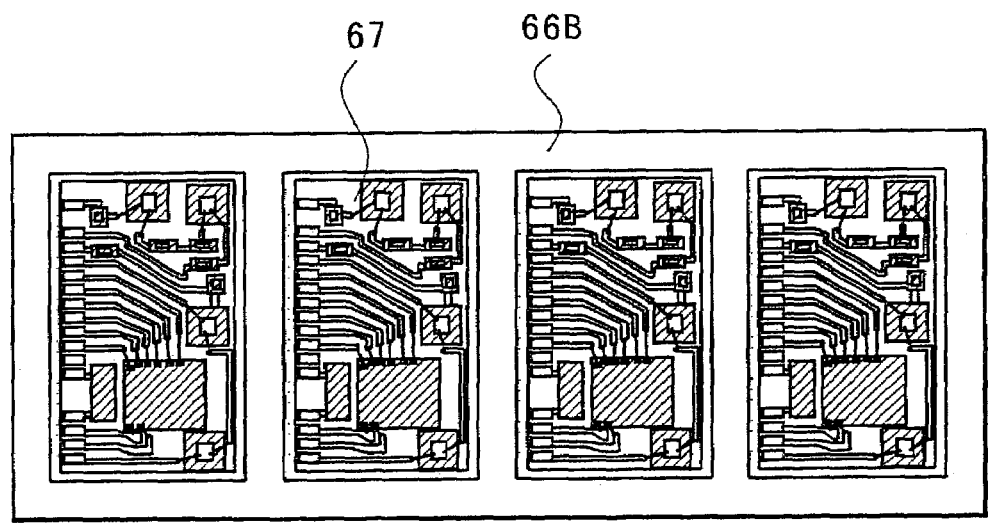
FIG. 26(A) is a plan view and FIG. 26(B) is a sectional view for explaining a hybrid integrated circuit device manufacturing method in the related art.
Figure 26B:
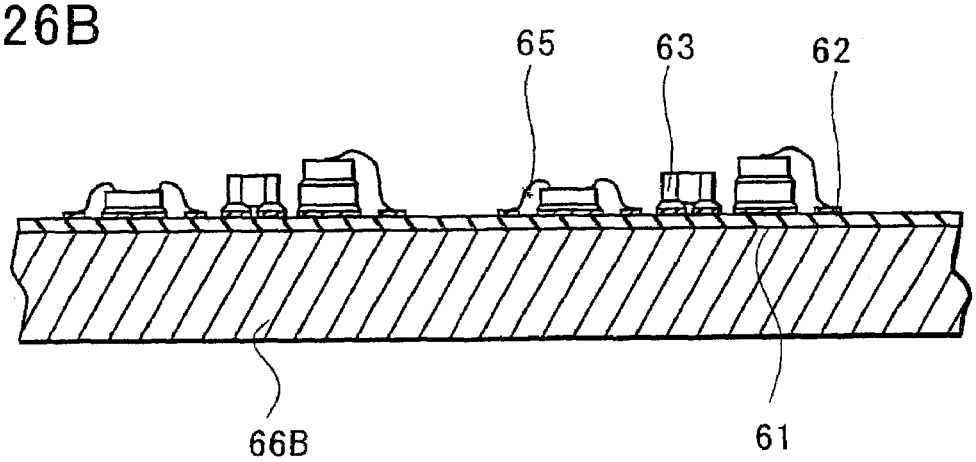
Figure 27:
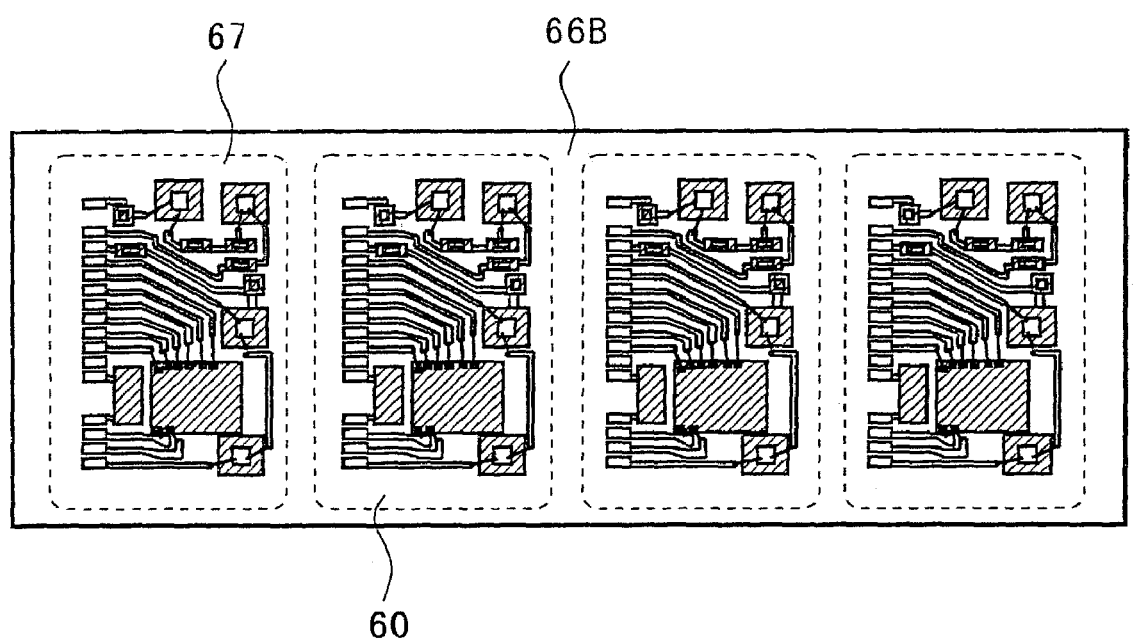
FIG. 27 is a plan view for explaining a hybrid integrated circuit device manufacturing method in the related art.

Fifth Step (See FIG. 23):

A preferred step of sealing circuit substrate 10 in an insulating resin 16 shall now be described with reference to FIG. 23. FIG. 23 is a sectional view, showing the step of sealing circuit substrate 10 in an insulating resin 16 by use of, e.g., a mold die 50.

First, circuit substrate 10 is preferably set on a lower mold die 50B. Insulating resin 16 can then be injected through a gate 53. In preferred embodiments, transfer molding using a thermosetting resin or injection molding using a thermosetting resin can be employed as the method of sealing. Air of an amount corresponding to the amount of the insulating resin 16 that is injected from gate 53 can be ejected from the interior of the cavity to the exterior via an air vent 54.

As mentioned above, inclined parts 10B are preferably provided at side face parts of circuit substrate 10. Thus, when sealing with insulating resin, insulating resin 16 is set around the vicinity of inclined part 10B. As a result, an anchor effect is provided between insulating resin 16 and the inclined part 10B and the joining of insulating resin 16 and circuit substrate 10 can be, thereby, fortified. In addition, in preferred embodiments, the cross-sectional shape of the part where the rear surface of circuit substrate 10 continues to an inclined part 10B is formed to have an obtuse angle. Preferably, the inclined part is not formed to have a rounded shape (such as, e.g., discussed above with respect to other embodiments). In this manner, entry of the insulating resin 16, which is injected through the gate 53, into parts between lower mold die 50B and the rear surface of circuit substrate 10 can be prevented.

Then, the circuit substrate 10, which has been sealed in resin in the above-described step, can be completed as a product upon being subject to, for example, a lead cutting step, etc. While in some of the embodiments described above, partitioning into individual circuit substrates 10 is preferably performed after forming a plurality of electrical circuits on the top surface of a large-size metal substrate 10B', this process may be changed in various embodiments. For example, an elongated metal substrate, with which two to eight circuit substrates (the number being by way of example only) can be formed in parallel, can be formed prior to mounting electrical circuits on the top surface of the metal substrate. Then, after arranging a plurality of electrical circuits on the elongated metal substrates, the individual circuit substrates can be partitioned. Here, the above-described partitioning methods (e.g., bending method and/or cutter 41 method) can be employed as illustrative methods of partitioning the circuit substrates.

In some circumstances, the foregoing embodiments can provide one or more, preferably all, of the following effects.

First, since flat parts 35B are preferably provided at blade edges 35A of a V-cut saw 35 for forming first grooves 20A and second grooves 20B in metal substrate 10B', the wear of blade edges 35A can be reduced. Additionally, early degradation of the cutting performance of V-cut saw 35 can thus be prevented. Furthermore, even in cases where first grooves 20A are to be formed on the surface of metal substrate 10B' on which resin layer 11 is provided, the formation of cracks in resin layer 11 can be prevented.

Second, since the first grooves 20A and the second grooves 20B are preferably formed in lattice form on the top and rear surfaces of the metal substrate 10B', the circuit substrates 10 can be partitioned readily at the locations where the grooves are formed. In preferred embodiments, one or both of the following methods of partitioning may be employed: partitioning by bending; or partitioning by circular cutter. And, partitioning can be performed readily with either of these methods.

5. Further Embodiments And Modifications

In various embodiments, the configurations of the grooves 20 (including, e.g., grooves 20A and/or 20B) can be modified depending on circumstances at hand. For example, while grooves with generally V-shaped cross-sections are preferred, in some embodiments, the grooves could have other cross-sectional configurations, such as, e.g., generally one of a U-shape, a semi-circular shape, a semi-elliptical shape, a rectangular shape, a polygonal shape and/or another desired shape.

In addition, in some preferred embodiments, the size (including width and/or depth) of the grooves 20B in the rear of the substrate is preferably larger than the size (including width and/or depth) of the grooves 20A in order to, for example, enable the area for the conductive patterns 12 and the circuit elements 13 to be maximized. For example, where V-shaped grooves are employed, the apexes of the grooves 20B preferably extend a greater distance into the substrate than the apexes of the grooves 20A. In some embodiments, for example, the apexes of the grooves 20B can extend even past a center plane of the substrate to within a top half of the substrate. Among other things, where the size of the grooves 20B is larger, one or more, preferably both, of the following advantages can be achieved if desired: a) increased mold-lock or anchor effect between the resin and the substrate and b) increased usable area for the conductive patterns and circuit elements.

In addition, while a variety of preferred partitioning means have been described herein, any known partitioning means can be employed in various other embodiments. For example, a related art punch press partitioning means could be employed or various partitioning means using other cutting means, such as, e.g., utilizing wave sources and/or other means could be employed.

While illustrative embodiments of the invention have been described herein, the present invention is not limited to the various preferred embodiments described herein, but includes any and all embodiments having modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." Means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited.

What is claimed is:

1. A method of manufacturing a hybrid integrated circuit device, comprising:
   preparing an aluminum or copper metal substrate having an insulating layer over a top surface, said insulating layer is a resin filled with a filler to actively transfer heat;
   forming conductive patterns over said insulating layer;
   forming lattices of grooves in a rear surface of said metal substrate and in a top surface of said metal substrate extending through said insulating layer;
   mounting a hybrid integrated circuit over at least one of said conductive patterns; and
   separating individual circuit substrates with a rotatable cutter contacting said metal substrate at locations corresponding to said grooves to cut remaining thicknesses of said metal substrate.

2. The method of claim 1, wherein said rotatable cutter is a circular cutter that rotates without an external drive.

3. The method of claim 1, wherein said rotatable cutter is a rotatable saw.

4. The method of claim 1, wherein said grooves have a generally V-shaped cross-section.

5. The method of claim 1, wherein a depth of said grooves is shallower than a thickness of said metal substrate.

6. The method of claim 1, wherein said metal substrate is formed of a material principally comprising aluminum or copper.

7. The method of claim 1, wherein said metal substrate is an aluminum substrate.

8. The method of claim 7, wherein top and rear surfaces of said aluminum substrate have been subject to alumite treatment.

9. The method of claim 1, wherein said insulating layer is a resin filled with alumina.

10. The method of claim 1, wherein in said step of forming the grooves, a cutting saw, with blade edges of a shape corresponding to a cross-section of said grooves, is rotated at a high speed to form said grooves.

11. A method of manufacturing a hybrid integrated circuit device, comprising:
    preparing an aluminum or copper metal substrate having an insulating layer over a top surface, said insulating layer is a resin filled with a filler to actively transfer heat;
    forming a plurality of conductive patterns over a top surface of said insulating layer;
    forming lattices of grooves in the top surface of said metal substrate which extend through the insulating layer and in the rear surface of said metal substrate;
    mounting a hybrid integrated circuit on at least one of said conductive patterns; and
    separating said metal substrate along said grooves into individual circuit substrates.

12. The method of claim 11, wherein said separating includes bending said metal substrate at the locations where said grooves were formed to separate said metal substrate into said individual circuit substrates.

13. The method of claim 11, wherein said separating includes separating individual circuit substrates with a rotatable cutter contacting said metal substrate at locations corresponding to said grooves to cut remaining thicknesses of said metal substrate and said insulating layer.

14. The method of claim 11, wherein said forming lattices of grooves includes using a cutting saw, with blade edges of a shape corresponding to a cross-section of said grooves, that is rotated at a high speed to form said grooves.

15. The method of claim 14, wherein the blade edges of said saw are substantially flat.

16. A method of manufacturing an integrated circuit device, comprising:
    preparing a copper or aluminum substrate having an insulating layer said insulating layer is a resin filled with a filler to actively transfer heat;

forming a plurality of conductive patterns over said insulating layer;

forming a plurality of grooves in at least a top surface of said substrate, wherein the grooves in said top surface extend through the insulating layer; and separating said substrate along said grooves into individual circuit substrates.

17. The method of claim 16, wherein said integrated circuit device is a hybrid integrated circuit device and said substrate is a metal substrate.

18. The method of claim 17, wherein said grooves are formed in both said top and bottom surfaces.

19. The method of claim 18, wherein said grooves are generally V-shaped in cross-section and substantially aligned to formed thinned regions in said substrate.

20. The method of claim 19, wherein said grooves in said bottom surface are deeper than said grooves in said top surface.

21. The method of claim 16, wherein said individual circuit substrates are formed with peripheral sides having inclined parts.

22. The method of claim 21, further including sealing said individual circuit substrates in an insulating resin.

23. The method of claim 22, further including sealing said individual circuit substrates in an insulating resin by transfer molding.

24. The method of claim 22, wherein during said sealing, insulating resin is set around said inclined parts, creating an anchor effect between the insulating resin and the inclined parts.

25. The method of claim 24, wherein said inclined parts are configured to inhibit entry of resin beneath the substrate during sealing.

26. The method of claim 16, wherein said individual circuit substrates are formed with said conductive patterns very near at least one peripheral end.

27. The method of claim 16, wherein said individual circuit substrates are formed with said conductive patterns within about 2 mm of at least one peripheral end.

28. The method of claim 16, wherein said individual circuit substrates are formed with said conductive patterns within about 1 mm of at least one peripheral end.

* * * * *